United States Patent
Byeon et al.

(10) Patent No.: US 12,272,704 B2
(45) Date of Patent: Apr. 8, 2025

(54) IMAGE SENSOR AND METHOD OF MANUFACTURING THE SAME

(71) Applicant: Samsung Electronics Co., Ltd., Suwon-si (KR)

(72) Inventors: Kyeongjae Byeon, Hwaseong-si (KR); Jinyoung Kim, Ulsan (KR); Seungjoo Nah, Gwangju (KR); Heegeun Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 413 days.

(21) Appl. No.: 17/744,045

(22) Filed: May 13, 2022

(65) Prior Publication Data

US 2023/0082070 A1 Mar. 16, 2023

(30) Foreign Application Priority Data

Sep. 10, 2021 (KR) .......................... 10-2021-0121117

(51) Int. Cl.
*H01L 27/146* (2006.01)

(52) U.S. Cl.
CPC .. *H01L 27/14612* (2013.01); *H01L 27/14621* (2013.01); *H01L 27/14623* (2013.01); *H01L 27/14627* (2013.01); *H01L 27/14645* (2013.01)

(58) Field of Classification Search
CPC ......... H01L 27/14612; H01L 27/14621; H01L 27/14623; H01L 27/14627; H01L 27/14645

See application file for complete search history.

(56) References Cited

U.S. PATENT DOCUMENTS

| | | | |
|---|---|---|---|
| 6,608,358 B1 | 8/2003 | Yamamoto | |
| 8,138,012 B2 | 3/2012 | Hotellier et al. | |
| 9,024,404 B1 | 5/2015 | Lee et al. | |
| 10,121,808 B1* | 11/2018 | Han | H01L 27/14687 |
| 10,170,511 B1* | 1/2019 | Huang | H01L 27/1462 |
| 2008/0048284 A1 | 2/2008 | Yun | |
| 2008/0296713 A1 | 12/2008 | Lee et al. | |
| 2023/0261026 A1* | 8/2023 | Cho | H01L 27/14687 257/432 |
| 2024/0222403 A1* | 7/2024 | Jeon | H01L 27/14645 |
| 2024/0258352 A1* | 8/2024 | Kim | H01L 27/146 |

FOREIGN PATENT DOCUMENTS

| | | |
|---|---|---|
| KR | 10-2007-0072999 A | 7/2007 |
| KR | 20100077988 A | 7/2010 |

* cited by examiner

*Primary Examiner* — David Vu
*Assistant Examiner* — Brandon C Fox
(74) *Attorney, Agent, or Firm* — Harness, Dickey & Pierce, P.L.C.

(57) ABSTRACT

An image sensor includes a substrate including a first region and a second region surrounding the first region, a light sensing element in the substrate, a planarization layer on the light sensing element, a color filter array layer including color filters on the planarization layer on the first region of the substrate, a light blocking metal pattern on the planarization layer on the second region of the substrate, a dummy color filter layer on the light blocking metal pattern on a portion of the second region adjacent to the first region of the substrate, and microlens on the color filter array layer. Active pixels are in the first region, and optical black (OB) pixels are in the second region.

19 Claims, 20 Drawing Sheets

IMAGE SENSOR AND METHOD OF MANUFACTURING THE SAME

CROSS-REFERENCE TO RELATED APPLICATION

This application claims priority under 35 USC § 119 to Korean Patent Application No. 10-2021-0121117, filed on Sep. 10, 2021 in the Korean Intellectual Property Office (KIPO), the contents of which are herein incorporated by reference in their entirety.

BACKGROUND

1. Field

Example embodiments relate to image sensors and methods of manufacturing the same.

2. Description of the Related Art

When an image sensor is manufactured, a color filter layer may be formed, an exposure process and a developing process may be performed on the color filter layer, and a rinsing process and a drying process may be performed. Components of a developing solution used in the developing process and components of the color filter layer may be mixed in a rinsing solution used in the rinsing process, which may remain after the drying process to generate spots. The spots may be mainly generated at an edge portion of an active pixel region in which active pixels are formed, which may cause image failure.

SUMMARY

Example embodiments provide image sensors having improved characteristics.

Example embodiments provide methods of manufacturing an image sensor having improved characteristics.

According to example embodiments, there is provided an image sensor. The image sensor may include a substrate including a first region and a second region surrounding the first region, a light sensing element in the substrate, a planarization layer on the light sensing element, a color filter array layer including color filters on the planarization layer on the first region of the substrate, a light blocking metal pattern on the planarization layer on the second region of the substrate, a dummy color filter layer on the light blocking metal pattern on a portion of the second region adjacent to the first region of the substrate, and microlens on the color filter array layer. Active pixels may be in the first region, and optical black (OB) pixels may be in the second region.

According to example embodiments, there is provided an image sensor. The image sensor may include a substrate including a first region and a second region surrounding the first region, a light sensing element in the substrate, a planarization layer on the light sensing element, a color filter array layer including first, second and third color filters for filtering first, second and third lights having first, second and third colors, respectively, on the planarization layer on the first region of the substrate, a light blocking metal pattern on the planarization layer on the second region of the substrate, a dummy color filter layer including a first dummy color filter that includes substantially the same material as the first color filter on the light blocking metal pattern on a portion of the second region adjacent to the first region of the substrate, and microlens on the color filter array layer. Active pixels may be in the first region, and optical black (OB) pixels may be in the second region. The first region of the substrate may have a shape of a rectangle in a plan view.

According to example embodiments, there is provided an image sensor. The image sensor may include a first substrate defining first, second, third and fourth regions at an inside and upper and lower spaces of the first substrate, a first insulating interlayer containing first wirings on the first substrate in the third region, a second insulating interlayer containing second wirings on the first insulating interlayer in the third region, a second substrate on the second insulating interlayer, a pixel division pattern defining a unit pixel region in which each unit pixel is in the second substrate in the first and second regions, a light sensing element in each unit pixel region, a transfer gate (TG) extending through a lower portion of the second substrate and contacting the light sensing element, a floating diffusion (FD) region at a lower portion of the second substrate adjacent to the TG, a lower planarization layer on the second substrate, a color filter array layer including color filters on the lower planarization layer, an interference blocking structure between the color filters, microlens on the color filter array layer, a light blocking metal pattern on the lower planarization layer in the second region, a dummy color filter layer on the light blocking metal pattern in a portion of the second region adjacent to the first region, a through via structure extending through the lower planarization layer, the second substrate, the second insulating interlayer, and an upper portion of the first insulating interlayer in the third region and commonly contacting the first and second wirings, a light blocking color filter layer on the light blocking metal pattern and the through via structure in the second and third regions, and a pad extending through the lower planarization layer and an upper portion of the second substrate. The second region may surround the first region, the third region may surround the second region, and the fourth region may surround the third region.

According to example embodiments, there is provided a method of manufacturing an image sensor. In the method, a light sensing element may be formed in a substrate including a first region and a second region surrounding the first region. Active pixels may be formed in the first region and optical black (OB) pixels may be formed in the second region. A planarization layer may be formed on the light sensing element. A light blocking metal pattern may be formed on the planarization layer on the second region of the substrate. A color filter array layer including color filters may be formed on the planarization layer on the first region of the substrate. A dummy color filter layer may be formed on the light blocking metal pattern on a portion of the second region adjacent to the first region of the substrate. A microlens may be formed on the color filter array layer.

According to example embodiments, there is provided a method of manufacturing an image sensor. In the method, a light sensing element may be formed in a substrate including a first region and a second region surrounding the first region. Active pixels may be formed in the first region, and optical black (OB) pixels may be formed in the second region. A planarization layer may be formed on the light sensing element. A light blocking metal pattern may be formed on the planarization layer on the second region of the substrate. A first color filter may be formed on the planarization layer on the first region of the substrate and a first dummy color filter on the light blocking metal pattern on the second region of the substrate. A second color filter may be formed on the planarization layer on the first region of the substrate and a light blocking color filter layer may be formed on the light blocking metal pattern on the second region of the substrate. A third color filter may be formed on the planarization layer on the first region of the substrate. A microlens may be formed on a color filter array layer, the color filter array layer including the first color filter, the second color filter, and the third color filter.

In the image sensor in accordance with example embodiments, spots may not be generated at an edge portion of the active pixel region, and thus an image may have enhanced image quality.

DESCRIPTION OF EMBODIMENTS

Image sensors and methods of manufacturing the same in accordance with example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

First to four regions I, II, III and IV may refer to only an inside of a reference substrate, a first substrate and/or a second substrate. Alternatively, the first to four regions I, II, III and IV may also refer to spaces over and under the reference substrate, the first substrate and/or the second substrate.

A direction substantially parallel to the reference substrate or the first substrate and/or the second substrate may be referred to as a horizontal direction, and a direction substantially perpendicular to the surface of the reference substrate or the first substrate and/or the second substrate may be referred to as a vertical direction. Moreover, when the words "generally" and "substantially" are used in connection with geometric shapes, it is intended that precision of the geometric shape is not required but that latitude for the shape, for example based on manufacturing tolerances, is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained in the specifications.

Figure 1:
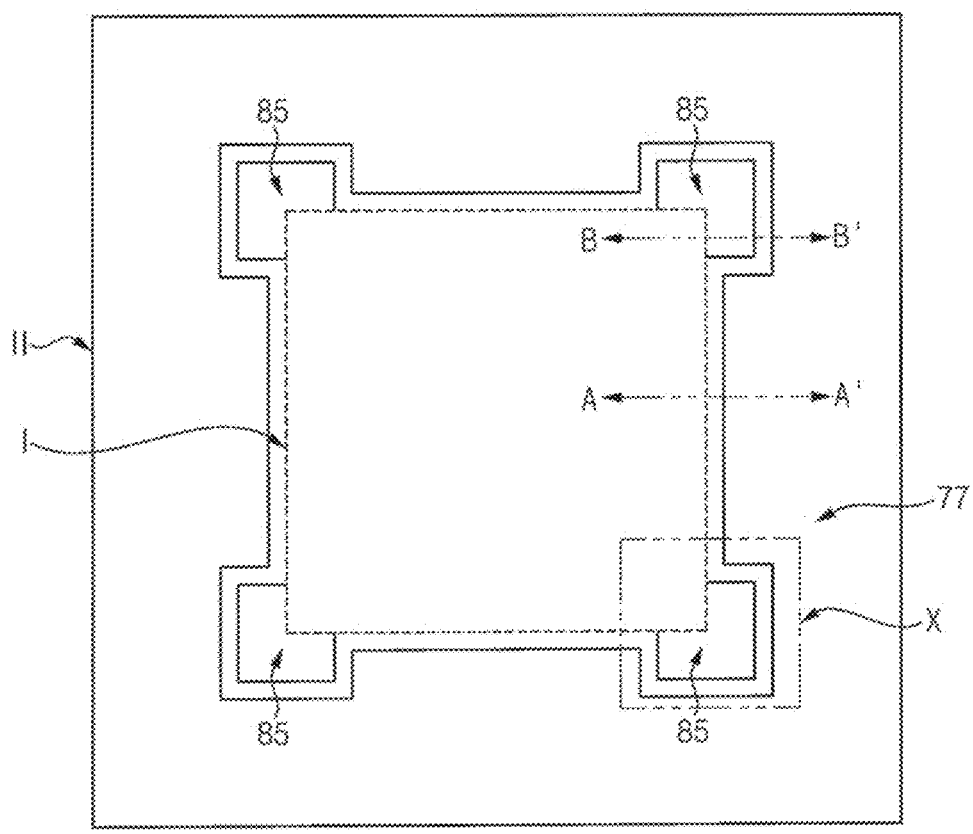
FIG. 1 is a plan view illustrating an active pixel region and an optical black (OB) region of an image sensor in accordance with example embodiments.
Figure 2:
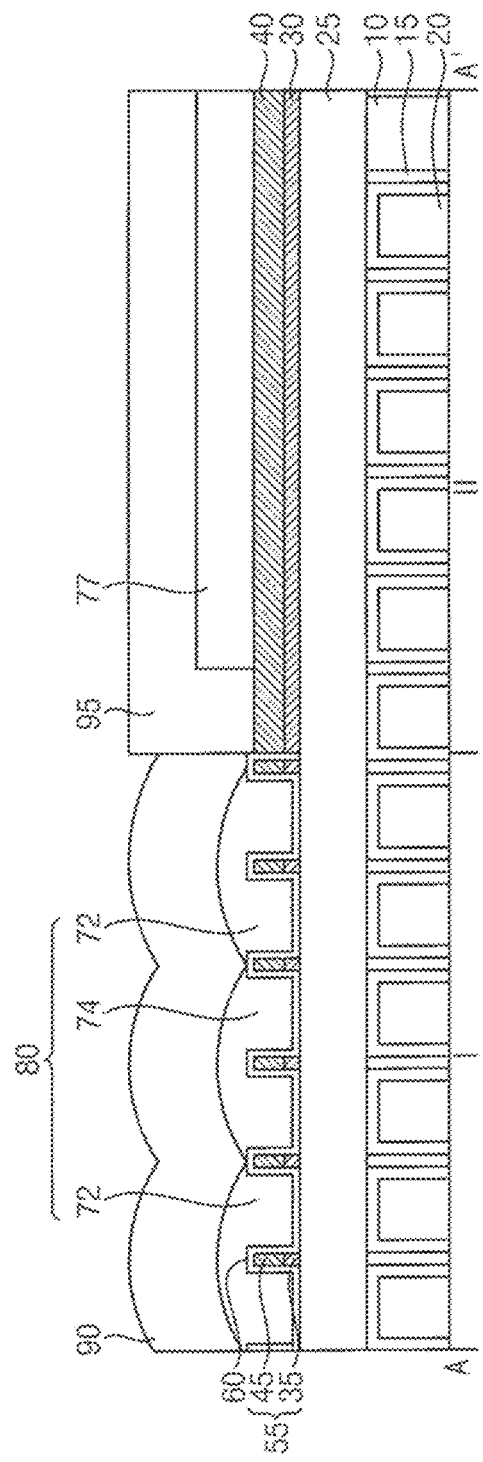
FIG. 2 is a cross-sectional view taken along line A-A' of FIG. 1.
Figure 3:
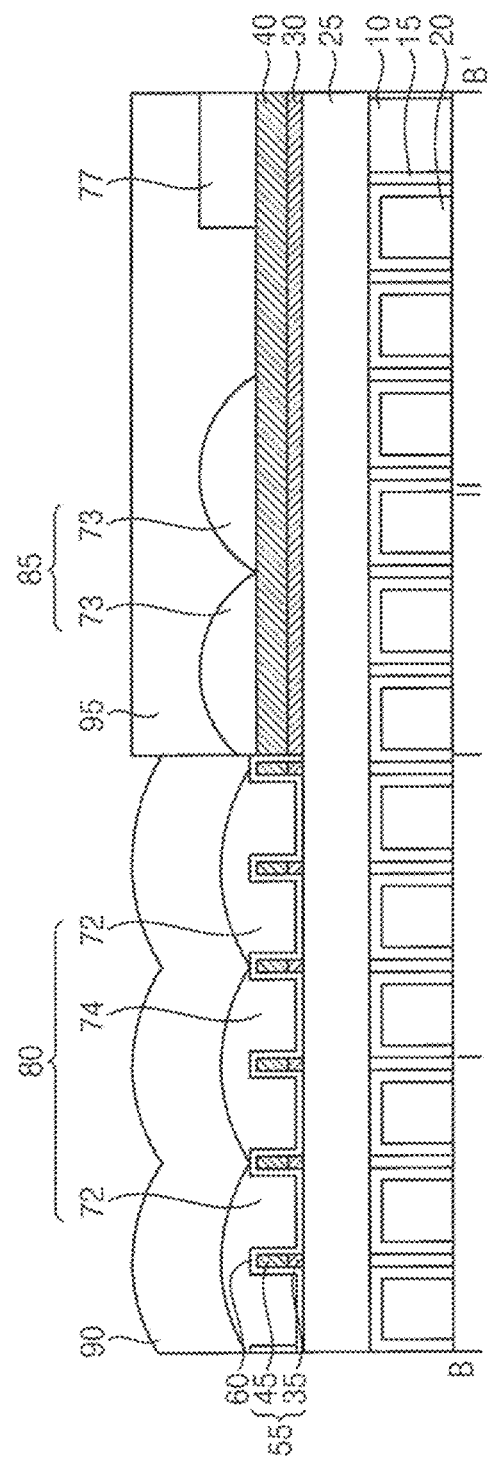
FIGS. 3 and 4 are cross-sectional views taken along line B-B' of FIG. 1.
Figure 4:
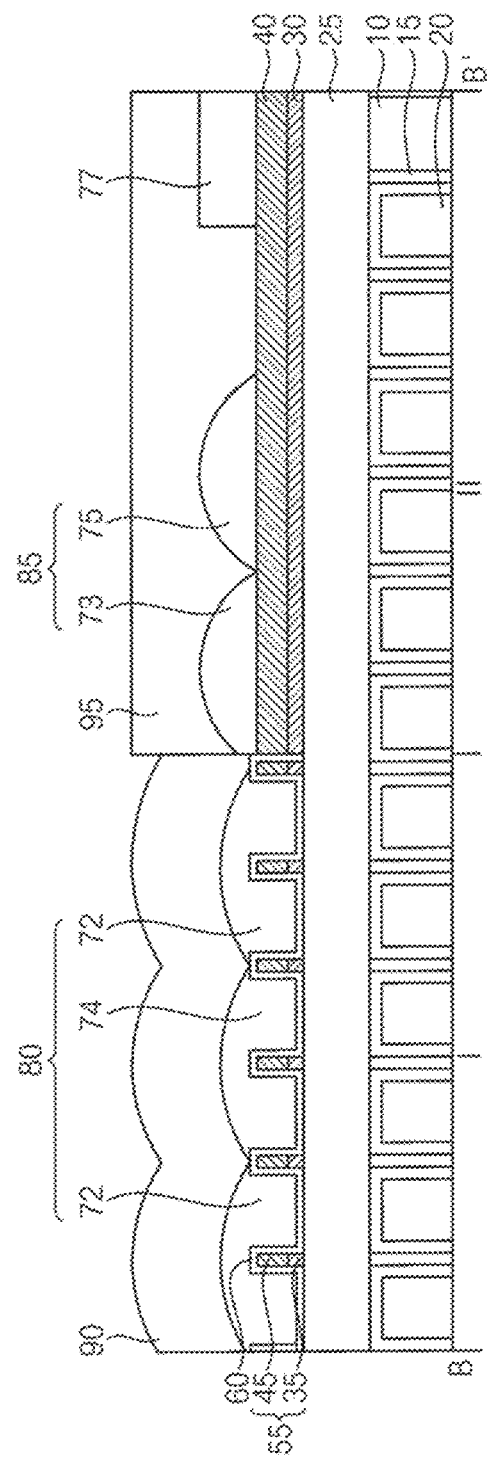
Figure 5:
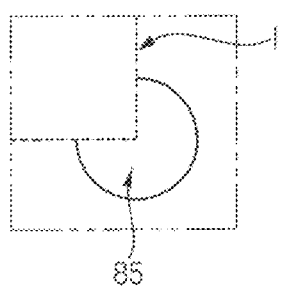
FIG. 5 includes plan views illustrating shapes of a dummy color filter layer in accordance with example embodiments.
Figure 5:
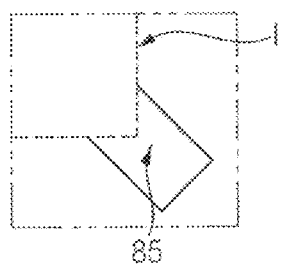
Figure 5:
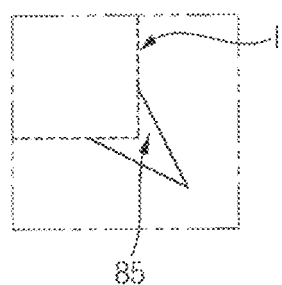
Figure 5:
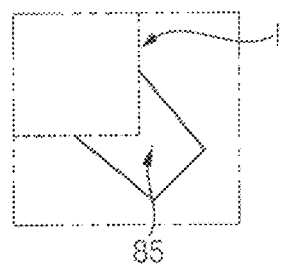

FIG. 1 is a plan view illustrating an active pixel region and an optical black (OB) region of an image sensor in accordance with example embodiments, FIG. 2 is a cross-sectional view taken along line A-A' of FIG. 1, FIGS. 3 and 4 are cross-sectional views taken along line B-B' of FIG. 1, and FIG. 5 includes plan views illustrating shapes of a dummy color filter layer in accordance with example embodiments.

Referring to FIGS. 1 to 3, the image sensor may include a light sensing element 20 in a substrate 10, a lower planarization layer 25 on the substrate 10, a color filter array layer 80 and a microlens 90 stacked on the lower planarization layer 25 in the first region I, a barrier pattern 30 and a light blocking metal pattern 40 stacked on the lower planarization layer 25 in the second region II, a dummy color filter layer 85 and a light blocking color filter layer 77 on the light blocking metal pattern 40, and an upper planarization layer 95 on the dummy color filter layer 85 and the light blocking color filter layer 77.

A transparent protection layer (not shown) may be further formed on the microlens 90 and the upper planarization layer 95.

In some example embodiments, in a plan view, the first region I may have a shape of a square or rectangle, and the second region II may surround the first region I and may have, e.g., a shape of a rectangular ring. The first region I may be an active pixel region in which active pixels are formed, and the second region II may be an OB pixel region in which OB pixels are formed.

In some example embodiments, the substrate 10 may include silicon, germanium, silicon-germanium, and/or a II-V group compound semiconductor, such as GaP, GaAs, or GaSb. In some example embodiments, a p-type well doped with p-type impurities may be formed partially or entirely in the substrate 10.

In some example embodiments, the light sensing element 20 may be a portion of a photodiode (PD). For example, the light sensing element 20 may be an n-type impurity region in the p-type well in the substrate 10, and the n-type impurity region and the p-type well may form the photodiode.

In some example embodiments, a pixel division pattern 15 may be formed in the substrate 10, and the light sensing element 20 included in each pixel may be formed in each region of the substrate 10 divided by the pixel division pattern 15. FIGS. 2 to 4 show that one light sensing element 20 is formed in each region, however, the inventive concepts may not be limited thereto, and a plurality of light sensing elements 20 may be formed in each region.

In some example embodiments, the pixel division pattern 15 may have a lattice shape in a plan view, and a unit pixel region in which each unit pixel may be formed may be defined in the substrate 10 by the pixel division pattern 15. In some example embodiments, a plurality of unit pixel regions may be arranged in the horizontal direction.

In some example embodiments, the pixel division pattern 15 may include a core and a shell. The core may include a semiconductor material, e.g., polysilicon, and the shell may include an insulating interlayer, e.g., silicon oxide. Alternatively, the pixel division pattern 15 may include a metal oxide, e.g., aluminum oxide, hafnium oxide, tantalum oxide, etc., and may have a single layer or a multi-layered structure including a plurality of layers sequentially stacked in the vertical direction.

The lower planarization layer 25 may be formed on an upper surface of the substrate 10, and may have a single layer or multi-layered structure including a plurality of layers sequentially stacked in the vertical direction. In some example embodiments, the lower planarization layer 25 may include first to fifth layers sequentially stacked in the vertical direction, and may include, e.g., aluminum oxide, hafnium oxide, silicon oxide, silicon nitride and hafnium oxide, respectively.

The color filter array layer 80 may include a plurality of color filters divided from each other by an interference blocking structure 55 that may correspond to the pixel division pattern 15 in the vertical direction. The color filter array layer 80 may include a plurality of color filters, e.g., a first color filter 72, a second color filter 74 and a third color filter, and FIGS. 2 to 4 show only the first and second color filters 72 and 74. The first color filter 72, the second color filter 74 and the third color filter may be arranged in the horizontal direction on the lower planarization layer 25 to form a color filter array. In some example embodiments, the first color filter 72, the second color filter 74 and the third color filter may be a green filter G, a blue filter B and a red filter R, respectively, however, the inventive concepts may not be limited thereto.

The interference blocking structure 55 may serve as a barrier that may block a light incident onto one pixel from moving to a neighboring pixel, so that light interference between neighboring pixels may be reduced or prevented. In some example embodiments, the interference blocking structure 55 may include first and second interference blocking patterns 35 and 45 stacked in the vertical direction. The first interference blocking pattern 35 may include a metal nitride, e.g., titanium nitride, tantalum nitride, etc. In some example embodiments, the second interference blocking pattern 45 may include a metal, e.g., tungsten. Alternatively, the second interference blocking pattern 45 may include a low refractive index material (LRIM), e.g., porous silicon oxide.

In some example embodiments, the first to third color filters G, B and R may be arranged in a Bayer pattern, however, the inventive concepts may not be limited thereto. One of the first to third color filters G, B and R that may filter different colors from each other may be arranged in each pixel, or in each of a plurality of pixels neighboring with each other.

In the latter case, neighboring color filters that may filter the same color may form a color filter group. That is, the first color filters G filtering a green light may be disposed adjacent to each other to form a first color filter group, the second color filters B filtering a blue light may be disposed adjacent to each other to form a second color filter group, and the third color filters R filtering a red light may be disposed adjacent to each other to form a third color filter group.

FIG. 2 shows four neighboring color filters filtering the same color form one color filter group (only two color filters among the four color filters are shown in the cross-sectional view), however, the inventive concepts may not be limited thereto. For example, nine neighboring color filter, sixteen color filters, etc., may form one color filter group.

Alternatively, the color filter array layer 80 may further include a fourth color filter W that may filter white color, and the first to fourth color filters G, B, R and W may be arranged in the horizontal direction by various types of arrangements. For example, one of the first to fourth color filters G, B, R and W that may filter different colors from each other may be arranged in each pixel, or in each of a plurality of pixels, which may form a corresponding color filter group.

Each of the first color filter 72, the second color filter 74 and the third color filter may be a film manufactured by depositing a composition that may be formed by mixing a pigment, a pigment dispersant, a binder resin and/or a solvent.

A protection layer 60 may be formed on an upper surface and a sidewall of the interference blocking structure 55 and an upper surface of the lower planarization layer 25, and thus lower surfaces and sidewalls of the first color filter 72, the second color filter 74 and the third color filter may be covered by the protection layer 60. The protection layer 60 may include a metal oxide, e.g., aluminum oxide.

A plurality of microlenses 90 may be formed on the color filter array layer 80 and the protection layer 60, and may condense light incident onto each pixel. In some example embodiments, each of the microlenses 90 may be disposed on a corresponding one of the first color filter 72, the second color filter 74 and the third color filter included in each pixel. Alternatively, each of the microlenses 90 may be commonly disposed on corresponding ones of the first color filter 72, the second color filter 74 and the third color filter included in neighboring pixels, respectively, e.g., ones of the first color filter 72, the second color filter 74 and the third color filter that may filter the same color. Each of the microlenses 90 may include, e.g., a photoresist material having a high transmittance.

The barrier pattern 30 may be formed on the lower planarization layer 25 in the second region II, and may include a metal nitride, e.g., titanium nitride, tantalum nitride, etc.

The light blocking metal pattern 40 may be formed on the barrier pattern 30 in the second region II, and may include a metal, e.g., tungsten.

The dummy color filter layer 85 may be formed on the light blocking metal pattern 40, and may be formed in a portion of the second region II adjacent to the first region I. In some example embodiments, the dummy color filter layer 85 may be formed in a portion of the second region II adjacent to each vortex of the rectangular shape of the first region I.

In some example embodiments, the dummy color filter layer 85 may have a shape of a portion of a square in a plan view. However, the inventive concepts may not be limited thereto, and the dummy color filter layer 85 may have various shapes. Referring to FIG. 5, for example, the dummy color filter layer 85 may have a shape of a portion of a circle, ellipse, rectangle, triangle, or trapezium.

In some example embodiments, the dummy color filter layer 85 may include a first dummy color filter 73. The first dummy color filter 73 may be a film manufactured by depositing a composition that may be formed by mixing a pigment, a pigment dispersant, a binder resin and a solvent. The first dummy color filter 73 may have a color corresponding to that of the first color filter 72, and for example, may be a dummy green filter G.

Referring to FIG. 4, the dummy color filter layer 85 may further include a second dummy color filter 75 and/or a third dummy color filter (not shown).

In some example embodiments, the first dummy color filter 73 may be formed at a portion of the second region II closest to the first region I, and the second dummy color filter 75 and/or the third dummy color filter may be formed at a portion of the second region II less close to the first region I.

Each of the second dummy color filter 75 and the third dummy color filter may be a film manufactured by depositing a composition that may be formed by mixing a pigment, a pigment dispersant, a binder resin and/or a solvent. The second dummy color filter 75 and the third dummy color filter may have colors corresponding to those of the second color filter 74 and the third color filter, respectively, and for example, may be a dummy blue filter G and a dummy red filter R, respectively.

In some example embodiments, the dummy color filter layer 85 may include a dummy color filter array that may include a plurality of first dummy color filters 73 arranged in the horizontal direction, or the first dummy color filter 73, the second dummy color filter 75 and/or the third dummy color filter are arranged in the horizontal direction.

Thus, in some example embodiments, like the first color filter 72, the second color filter 74 and the third color filter, the first dummy color filter 73, the second dummy color filter 75 and the third dummy color filter may be arranged in a Bayer pattern or other patterns. Neighboring dummy color filters that may filter the same color may form a dummy color filter group, and a plurality of dummy color filter groups may be arranged in a Bayer pattern or other patterns.

In some example embodiments, each dummy color filter included in the dummy color filter layer 85 may have a thickness and width similar to or the same as that of each color filter included in the color filter array layer 80. Alternatively, each dummy color filter included in the dummy color filter layer 85 may have a thickness similar to or the same as that of each color filter included in the color filter array layer 80, but may have a width different from that of each color filter included in the color filter array layer 80.

The light blocking color filter layer 77 may be formed on the light blocking metal pattern 40, and may be formed in the second region II. In some example embodiments, the light blocking color filter layer 77 may be spaced apart from the first region I and the dummy color filter layer 85 by a given distance in the horizontal direction. In some example embodiments, the light blocking color filter layer 77 may include the same composition as the second color filter 74, which may absorb a light having a relatively large wavelength among the first color filter 72, the second color filter 74 and the third color filter, that is, the blue filter B.

The upper planarization layer 95 may be formed on the dummy color filter layer 85, the light blocking color filter layer 77 and the light blocking metal pattern 40 in the second region II. In some example embodiments, the upper planarization layer 95 may include the same material as the microlens 90.

As illustrated above, the image sensor may include the dummy color filter layer 85 in the portion of the second region II adjacent to the first region I in which the active pixels are formed. Thus, as illustrated below, when the color filter array layer 80 is formed in the first region I, the dummy color filter layer 85 may also be formed in the second region II, and spots that may be generated during post processes, e.g., an exposure process, a developing process, a rinsing process and a drying process may not be formed at edge portions of the first region I but may be formed in the second region II. Accordingly, image failure due to the spots may be reduced, which will be illustrated in detail with reference to FIGS. 16 and 20.

Figure 6:
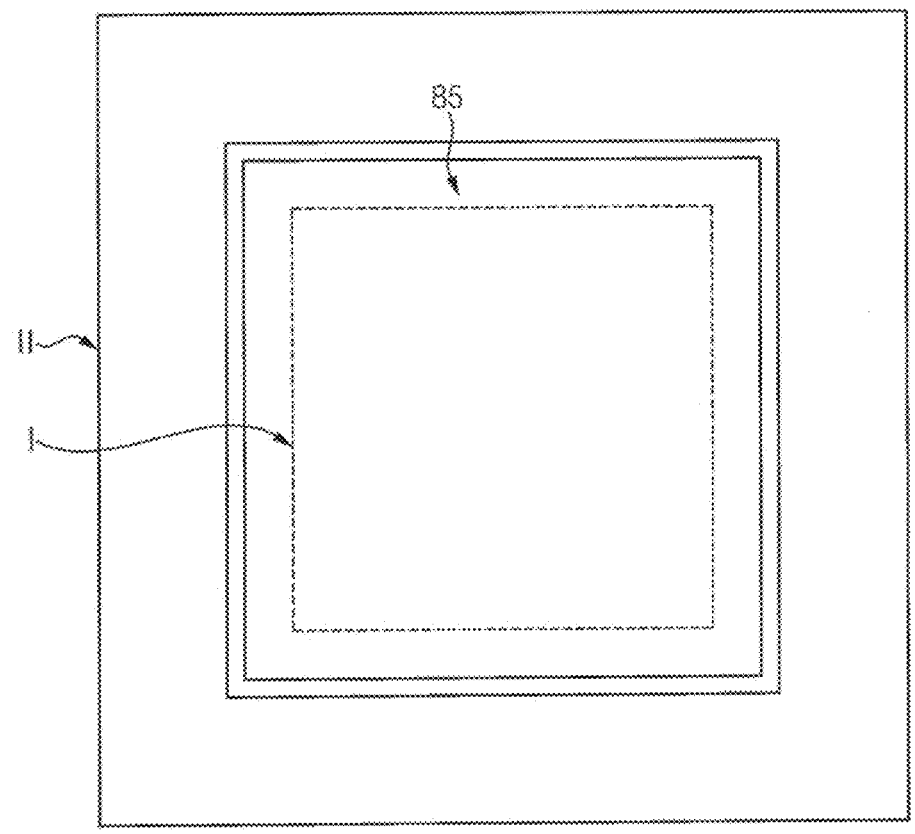
FIG. 6 is a plan view illustrating an active pixel region and an optical black (OB) region of an image sensor in accordance with example embodiments.

FIG. 6 is a plan view illustrating an active pixel region and an optical black (OB) region of an image sensor in accordance with example embodiments. This image sensor may be substantially the same as or similar to that of FIGS. 1 to 5, except for the shapes of the dummy color filter layer and the light blocking color filter layer, and thus repeated explanations are omitted herein.

Referring to FIG. 6, the dummy color filter layer 85 may be formed in a portion of the second region II adjacent to the first region I, however, unlike that of FIG. 1, the dummy color filter layer 85 may be formed in a portion of the second region II adjacent to four sides of the first region I having a rectangular shape. That is, the dummy color filter layer 85 may surround the first region I, and may have a shape of a rectangular ring in a plan view.

Thus, spots may not be generated at portions of the second region II adjacent to not only each vertex but also each side of the first region I having the rectangular shape.

The light blocking color filter layer 77 may be formed in the second region II, and may be spaced apart by a given distance in the horizontal direction from the dummy color filter layer 85 surrounding the first region I.

Figure 7:
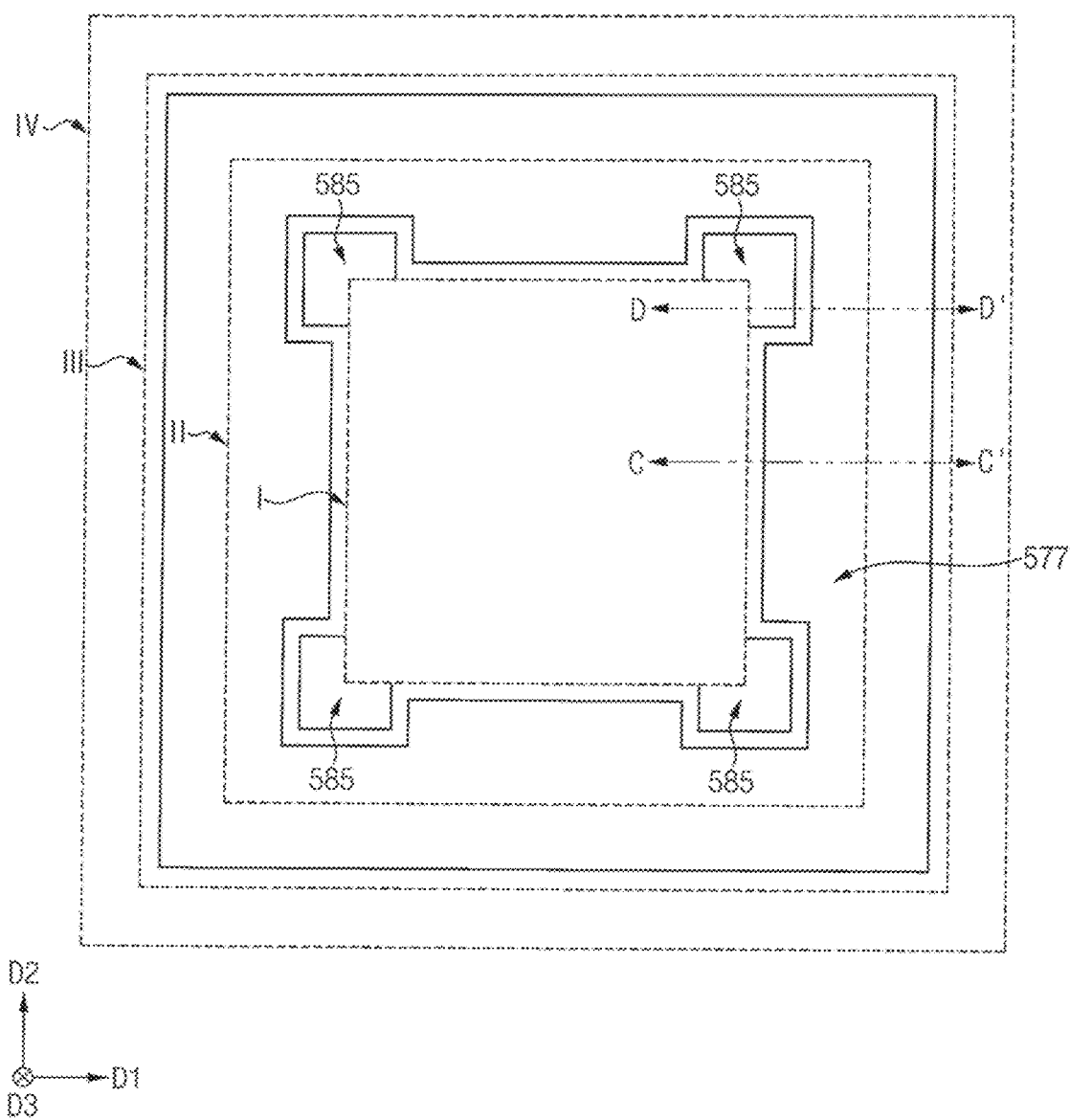
FIG. 7 is a plan view illustrating an image sensor in accordance with example embodiments.
Figure 8:
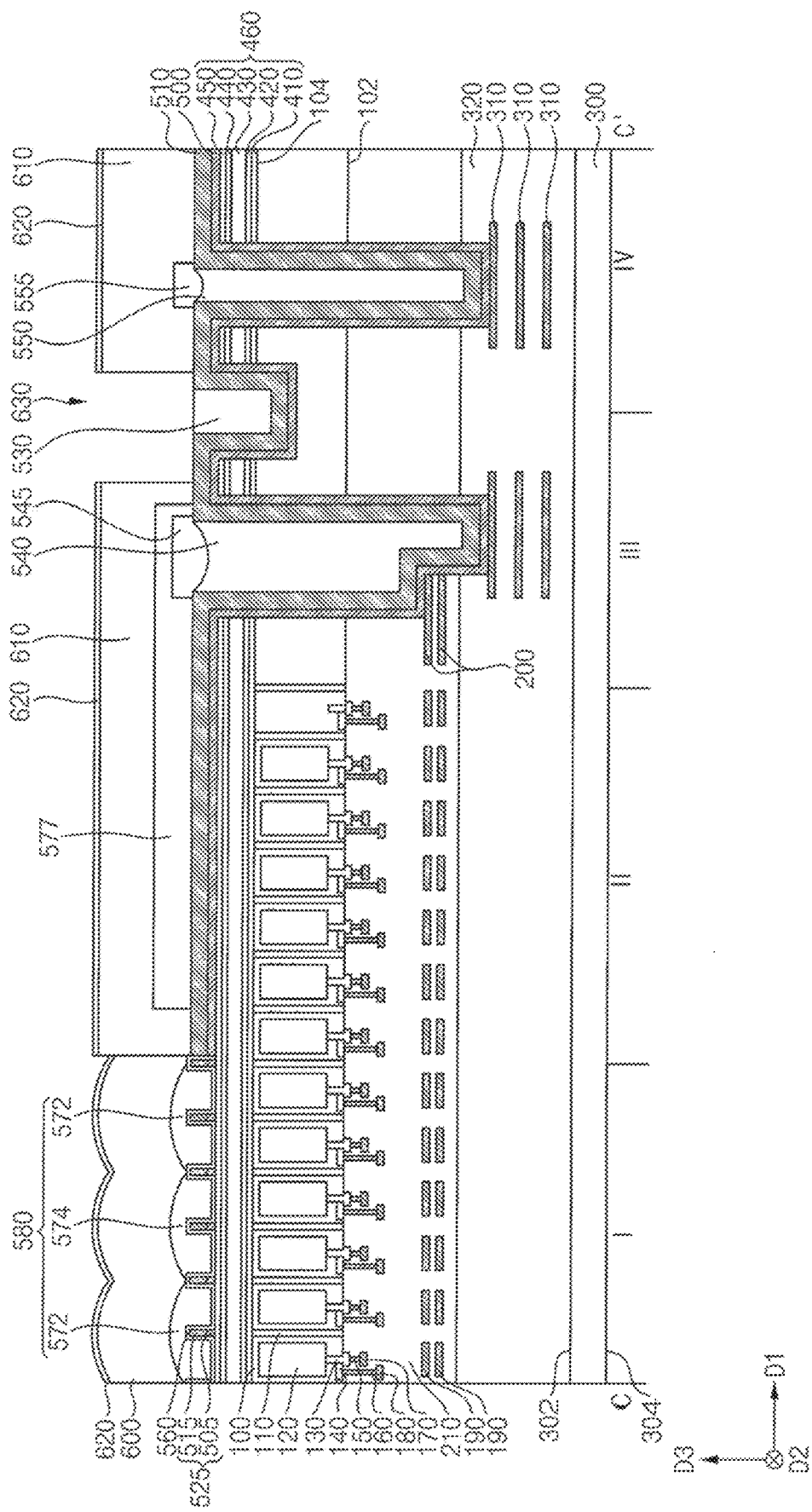
FIGS. 8 and 9 are cross-sectional views taken along lines C-C' and D-D', respectively, of FIG. 6.
Figure 9:
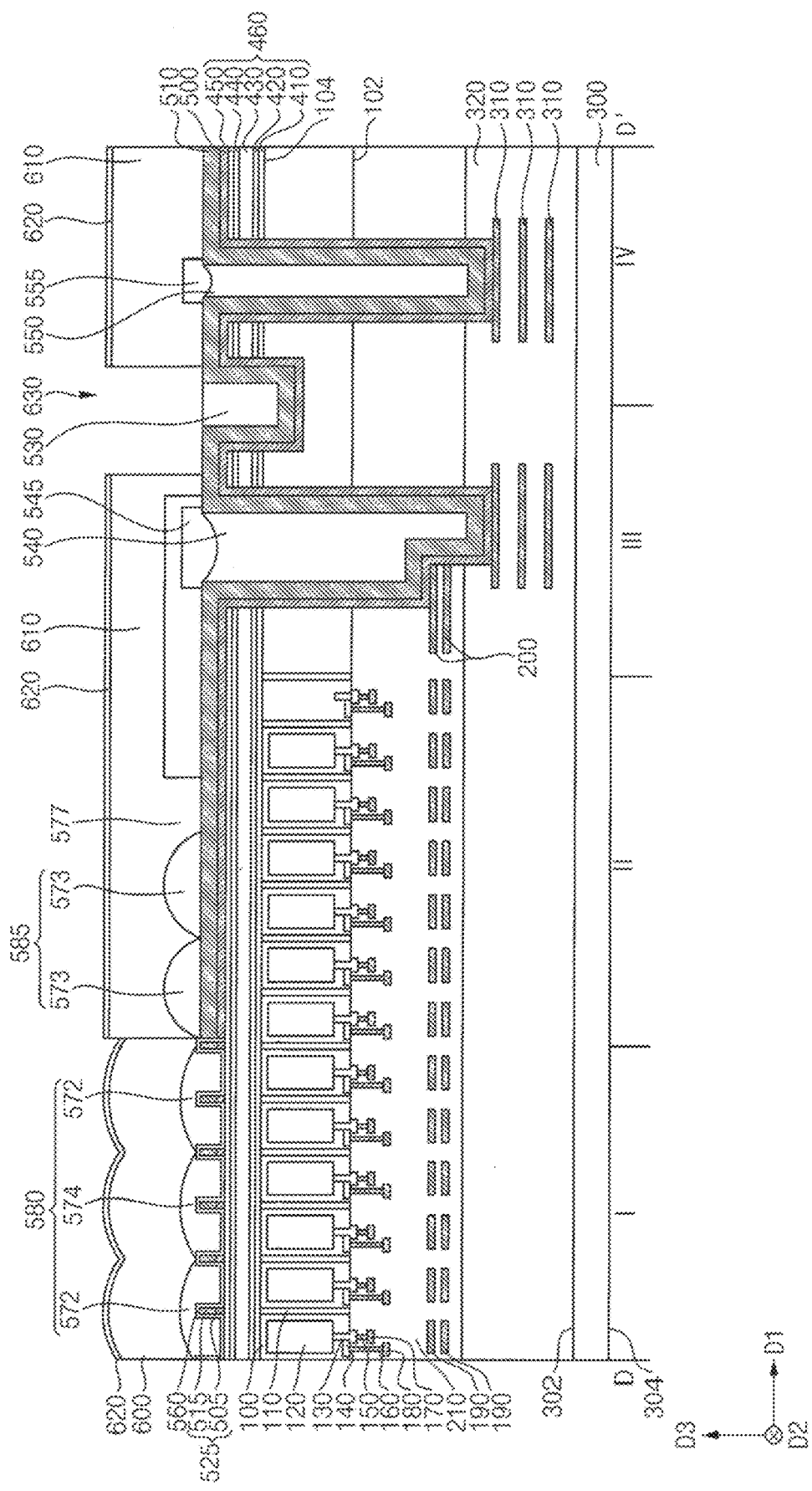

FIG. 7 is a plan view illustrating an image sensor in accordance with example embodiments, and FIGS. 8 and 9 are cross-sectional views taken along lines C-C' and D-D', respectively, of FIG. 6.

The image sensor shown in FIGS. 1 to 6 includes only the active pixel region and the OB pixel region, while the image sensor shown in FIGS. 7 to 9 may further include a stack region III surrounding the OB pixel region and a pad region IV. Thus, components of the image sensors in the active pixel region and the OB pixel region may be substantially the same as or similar to each other, and repeated explanations are omitted herein.

Hereinafter, in the specifications (but not necessarily in the claims), two directions substantially parallel to a first surface 102 of a first substrate 100 and substantially perpendicular to each other may be referred to as first and second directions D1 and D2, respectively, and a direction substantially perpendicular to the first surface 102 of the first substrate 100 may be referred to as a third direction D3. In some example embodiments, the first and second directions D1 and D2 may be substantially perpendicular to each other.

Referring to FIGS. 7 to 9, the image sensor may include a second substrate 300, a second insulating interlayer 320, a first insulating interlayer 210, the first substrate 100, and a lower planarization layer 460 sequentially stacked in the third direction D3 in the first to fourth regions I, II, III and IV. A color filter array layer 580, a microlens 600 and a transparent protection layer 620 may be sequentially stacked on the lower planarization layer 460 in the first region I, a barrier pattern 500 and a conductive pattern 510 may be sequentially stacked on the lower planarization layer 460 in the second and third regions II and III. A dummy color filter layer 585 and a light blocking color filter layer 577 may be formed on the conductive pattern 510, an upper planarization layer 610 may be formed on the conductive pattern 510 to cover the dummy color filter layer 585 and the light blocking color filter layer 577, and the transparent protection layer 620 may be formed on the upper planarization layer 610. The upper planarization layer 610 and the transparent protection layer 620 may be stacked on the lower planarization layer 460 in the fourth region IV.

The image sensor may further include first, second and third wirings 170, 180 and 190 and first and second vias 150 and 160 contained in the first insulating interlayer 210, a pixel division pattern 110 extending through the first substrate 100 in the third direction D3, a light sensing element 120 in a unit pixel region defined by the pixel division pattern 110, a transfer gate (TG) 130 extending through a lower portion of the first substrate 100 and having a lower portion protruding downwardly from the first surface 102 of the first substrate 100 and covered by the first insulating interlayer 210, and a floating diffusion (FD) region 140 at a lower portion of the first substrate 100 adjacent to the TG 130 in the first and second regions I and II.

The image sensor may further include an interference blocking structure 525 between color filters 572 and 574 included in the color filter array layer 580 and a protection layer 560 covering a surface of the interference blocking structure 525 on the lower planarization layer 460.

The image sensor may further include a fourth wiring 200 contained in the first insulating interlayer 210, a fifth wiring 310 contained in the second insulating interlayer 320, and a first through via structure extending through the lower planarization layer 460, the first substrate 100, the first insulating interlayer 210 and an upper portion of the second insulating interlayer 320 to commonly contact the fourth and fifth wirings 200 and 310 in the third region III.

The image sensor may further include the fifth wiring 310 contained in the second insulating interlayer 320, a pad 530 extending through the lower planarization layer 460 and an upper portion of the first substrate 100, and a second through via structure extending through the lower planarization layer 460, the first substrate 100, the first insulating interlayer 210 and an upper portion of the second insulating interlayer 320 to contact the fifth wiring 310 in the fourth region IV.

The image sensor may further include various transistors under the first substrate 100 adjacent to the first surface 102 of the first substrate 100. The transistors may include, e.g., a source follower transistor, a reset transistor, and a select transistor. The TG 130, the FD region 140, and the light sensing element 120 may form a transfer transistor. The light sensing element 120 may serve as a source region of the transfer transistor, and the FD region 140 may serve as a drain region of the transfer transistor.

In some example embodiments, in a plan view, the first region I may have a shape of a square or rectangle, the second region II may surround the first region I, the fourth region IV may surround the second region II, and the third region III may be disposed in the fourth region IV, however, the inventive concepts may not be limited thereto.

In some example embodiments, the first region I may be an active pixel region in which active pixels are formed, the second region II may be an optical black (OB) region in which OB pixels are formed, the third region III may be a stack region in which the first through via structure is formed, and the fourth region IV may be a pad region in which the pads 530 are formed.

The first substrate 100 may include the first surface 102 and a second surface 104 opposite the first surface 102, and the second substrate 300 may include a third surface 302 and a fourth surface 304 opposite the third surface 302. FIGS. 8 and 9 show the first surface 102 is under the second surface 104, and the third surface 302 is over the fourth surface 304.

In some example embodiments, p-type impurities may be doped into the first substrate 100 partially or entirely to form a p-type well therein.

The pixel division pattern 110 may extend in the third direction D3 in the first and second regions I and II of the first substrate 100, and may be arranged in a lattice pattern in the first and second directions D1 and D2, in a plan view. A unit pixel region defined by the pixel division pattern 110 may be arranged in the first and second directions D1 and D2.

In some example embodiments, the light sensing element 120 may be a portion of a photodiode (PD). The light sensing element 120 may be an n-type impurity region in the p-type well in the first and second regions I and II of the first substrate 100, and thus the light sensing element 120 and the p-type well may form a PN junction diode. In some example embodiments, p-type impurities may be highly doped into a portion of the first substrate 100 adjacent to the pixel division pattern 110, and thus the PN junction diode may have enhanced characteristics.

The light sensing element 120 may be formed in each unit pixel region defined by the pixel division pattern 110 in the first and second regions I and II of the first substrate 100, however, may not be formed some of the unit pixel regions defined by the pixel division pattern 110 in the second region II of the first substrate 100.

The TG 130 may include a buried portion extending in the third direction D3 upwardly from the first surface 102 of the first substrate 100, and a protruding portion beneath the buried portion and having a lower surface lower than the first surface 102 of the first substrate 100.

The FD region 140 may be adjacent to the first surface 102 of the first substrate 100 and the TG 130, and may be, e.g., an n-type impurity region.

The first via 150 may contact the overlying TG 130, and may be connected to the underlying first wiring 170. The second via 160 may contact the overlying FD region 140, and may be connected to the underlying second wiring 180.

Vias and wirings connected to the various transistors, that is, the source follower transistor, the reset transistor, and the select transistor may be further formed in the first insulating interlayer 210 in the first and second regions I and II. FIGS. 8 and 9 show each of the third and fourth wirings 190 and 200 are formed at two levels in the third direction D3, however, the inventive concepts may not be limited thereto, and may be formed at more than two levels.

Each of the first and second insulating interlayers 210 and 320 may include an oxide, e.g., silicon oxide, or a low-k dielectric material.

In some example embodiments, the lower planarization layer 460 may include first, second, third, fourth and fifth layers 410, 420, 430, 440 and 450 sequentially stacked in the third direction D3. For example, the first to fifth layers 410, 420, 430, 440 and 450 may include aluminum oxide, hafnium oxide, silicon oxide, silicon nitride and hafnium oxide, respectively.

The interference blocking structure 525 may be formed on the lower planarization layer 460 to overlap the pixel division pattern 110 in the third direction D3, and may have a lattice pattern in a plan view. In some example embodiments, the interference blocking structure 525 may include first and second interference blocking patterns 505 and 515 stacked in the third direction D3. The first interference blocking pattern 505 may include a metal nitride, and the second interference blocking pattern 515 may include a metal. Alternatively, the second interference blocking pattern 515 may include a low refractive index material (LRIM), e.g., silicon oxide.

The protection layer 560 may include a metal oxide, e.g., aluminum oxide.

The color filter array layer 580 may be formed on the protection layer 560, and thus a lower surface and a sidewall of each of the first color filter 572, the second color filter 574 and the third color filter included in the color filter array layer 580 may be covered by the protection layer 560. The first color filter 572, the second color filter 574 and the third color filter may be a green filter G, a blue filter B and a red filter R, respectively.

In some example embodiments, the dummy color filter layer 585 may include first dummy color filters 573. Alternatively, dummy color filter layer 585 may further include second dummy color filters and/or third dummy color filters. The first dummy color filter 573 may include the same material as the first color filter 572, the second dummy color filter may include the same material as the second color filter 574, and third dummy color filter may include the same material as the third color filter.

The dummy color filter layer 585 and the color filter array layer 580 will be illustrated in detail below with reference to FIGS. 10 to 20.

The light blocking layer 577 may include the same composition as the second color filter 524, which may absorb a light having a relatively large wavelength among the first and second color filters 522 and 524 and the third color filter.

The light blocking layer 577 may be formed on the lower planarization layer 460 and the first through via structure in the second and third regions II and III of the first substrate 100, and may be spaced apart by a given distance in the horizontal direction from the first region I and the dummy color filter layer 585.

The first through via structure may include a first filling pattern 540 extending in the third direction D3 through the lower planarization layer 460, the first substrate 100, the first insulating interlayer 210 and an upper portion of the second insulating interlayer 320, a conductive pattern 510 covering a lower surface and a sidewall of the first filling pattern 540, a barrier pattern 500 covering a lower surface and a sidewall of the conductive pattern 510, and a first capping pattern 545 on an upper surface of the first filling pattern 540.

The second through via structure may include a second filling pattern 550 extending in the third direction D3 through the lower planarization layer 460, the first substrate 100, the first insulating interlayer 210 and an upper portion of the second insulating interlayer 320, the conductive pattern 510 covering a lower surface and a sidewall of the second filling pattern 540, the barrier pattern 500 covering the lower surface and the sidewall of the conductive pattern 510, and a second capping pattern 555 on an upper surface of the second filling pattern 550.

Each of the first and second filling patterns 540 and 550 may include, e.g., a low refractive index material (LRIM), and each of the first and second capping patterns 545 and 555 may include, e.g., a photoresist material.

A portion of the conductive pattern 510 included in the first through via structure may commonly contact the fourth and fifth wirings 200 and 310 so that the fourth and fifth wirings 200 and 310 may be electrically connected with each other, and a portion of the conductive pattern 510 included in the second through via structure may contact the fifth wiring 310 so as to be electrically connected thereto.

The conductive pattern 510 may be included in the first and second through via structures, and may also be formed on the lower planarization layer 460 in the second to fourth regions II, III and IV. A portion of the conductive pattern 510 in the second and third regions II and III may be referred to as a light blocking metal pattern.

The conductive pattern 510 may include a metal, e.g., tungsten, and the barrier pattern 500 may include a metal nitride, e.g., titanium nitride.

The pad 530 may be electrically connected with an outer wiring, and may be a path through which electrical signals may be input into the active pixels and/or the OB pixels, or electrical signals may be output from the active pixels and/or the OB pixels. The pad 530 may include a metal, e.g., aluminum. A lower surface and a sidewall of the pad 530 may be covered by the conductive pattern 510.

The microlens 600 may be formed on the color filter array layer 580 and the protection layer 560 in the first region I, and the upper planarization layer 610 may be formed on the light blocking layer 577 and the second through via structure in the second to fourth regions II, III and IV, however, the upper planarization layer 610 may include a third opening 630 exposing an upper surface of the pad 530 in the fourth region IV. In some example embodiments, the microlens 600 and the upper planarization layer 610 may include substantially the same material, e.g., a photoresist material having a high transmittance.

The transparent protection layer 620 may be formed on the microlens 600 and the upper planarization layer 610. The transparent protection layer 620 may include, e.g., SiO, SiOC, SiC, SiCN, etc.

FIGS. 10 to 20 are cross-sectional views illustrating a method of manufacturing an image sensor in accordance with example embodiments.

Figure 10:
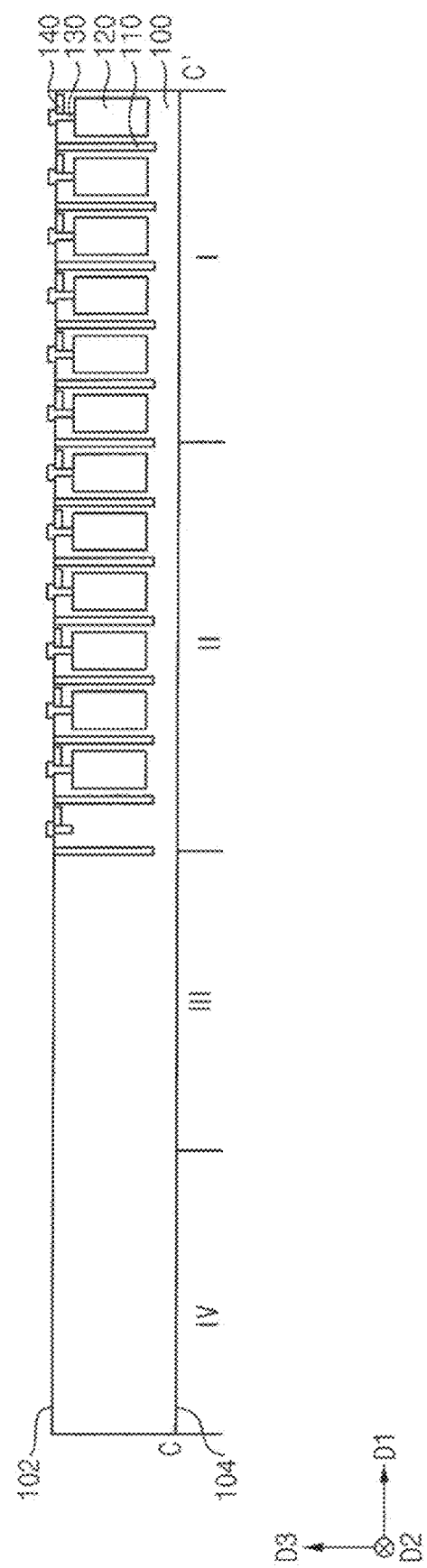
FIGS. 10 to 20 are cross-sectional views illustrating a method of manufacturing an image sensor in accordance with example embodiments.

Referring to FIG. 10, a pixel division pattern 110 and a light sensing element 120 may be formed in the first substrate 100 including first, second, third and fourth regions I, II, III and IV, and a TG 130 and an FD region 140 may be formed.

In some example embodiments, p-type impurities may be doped into a portion or an entire portion of the first substrate 100 to form a p-type well.

The pixel division pattern 110 may fill a first trench extending in the third direction D3 from a first surface 102 downwardly in the first and second regions I and II of the first substrate 100 including the first surface 102 and a second surface 104 opposite to the first surface 102.

In some example embodiments, the light sensing element 120 may be a portion of a photodiode (PD). Thus, the light sensing element 120 may be formed by doping n-type impurities into the p-type well in the first and second regions I and II of the first substrate 100, and thus the light sensing element 120 and the p-type well may form a PN junction diode. In some example embodiments, after forming the first trench for forming the pixel division pattern 110, p-type impurities may be highly doped at a portion of the first substrate 100 adjacent to the first trench, and thus the PN junction diode may have enhanced performance.

Alternatively, after forming the light sensing element 120, the pixel division pattern 110 may be formed.

The TG 130 may fill a second trench extending in the third direction D3 from the first surface 102 downwardly. In some example embodiments, the TG 130 may include a buried portion filling the second trench, and a protruding portion on the buried portion and having an upper surface higher than the first surface 102 of the first substrate 100.

For example, n-type impurities may be doped into a portion of the first substrate 100 adjacent to the first surface 102 and the TG 130 to form the FD region 140.

Figure 11:
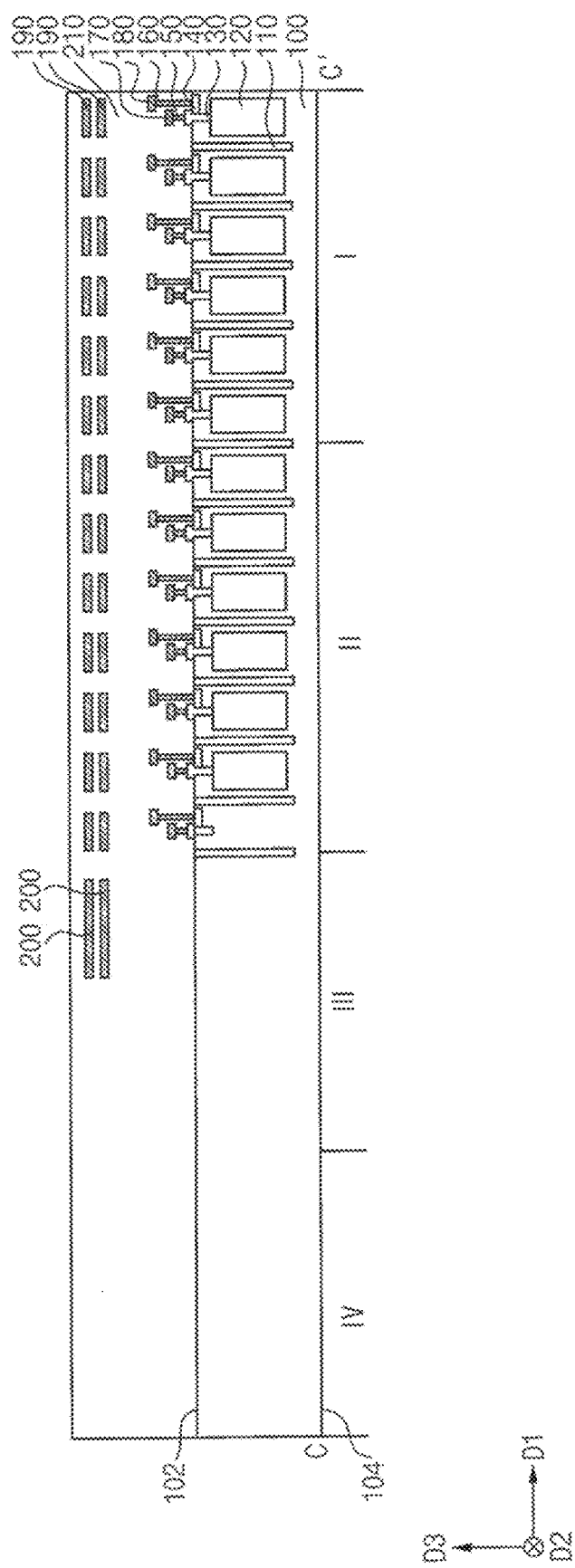

Referring to FIG. 11, a first insulating interlayer 210 containing first and second vias 150 and 160 and first to fourth wirings 170, 180, 190 and 200 may be formed on the first surface 102 of the first substrate 100.

In some example embodiments, the first and second vias 150 and 160 and the first to fourth wirings 170, 180, 190 and 200 may be formed by a dual damascene process or a single damascene process.

Figure 12:
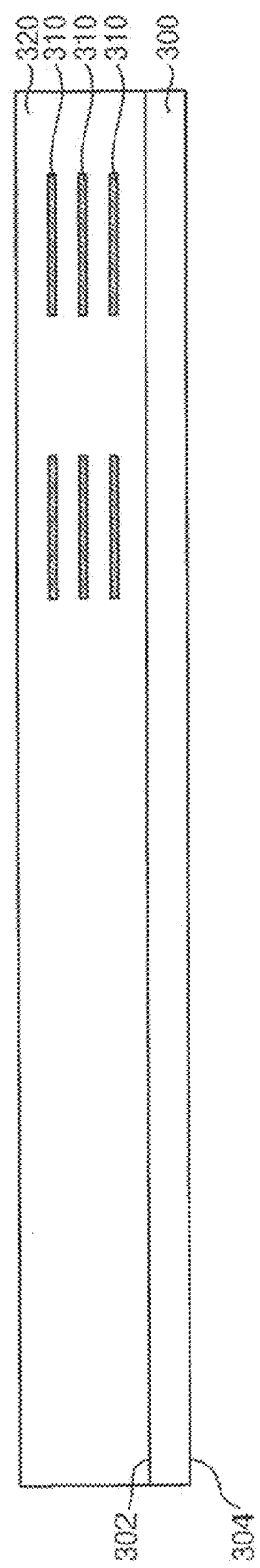

Referring to FIG. 12, a second insulating interlayer 320 containing a fifth wiring 310 may be formed on a third surface 302 of the second substrate 300 including the third surface 302 and a fourth surface 304 opposite thereto.

FIG. 12 shows the fifth wiring 310 is formed at three levels, however, the inventive concepts may not be limited thereto. In some example embodiments, the fifth wirings 310 may be formed by a dual damascene process or a single damascene process.

Figure 13:
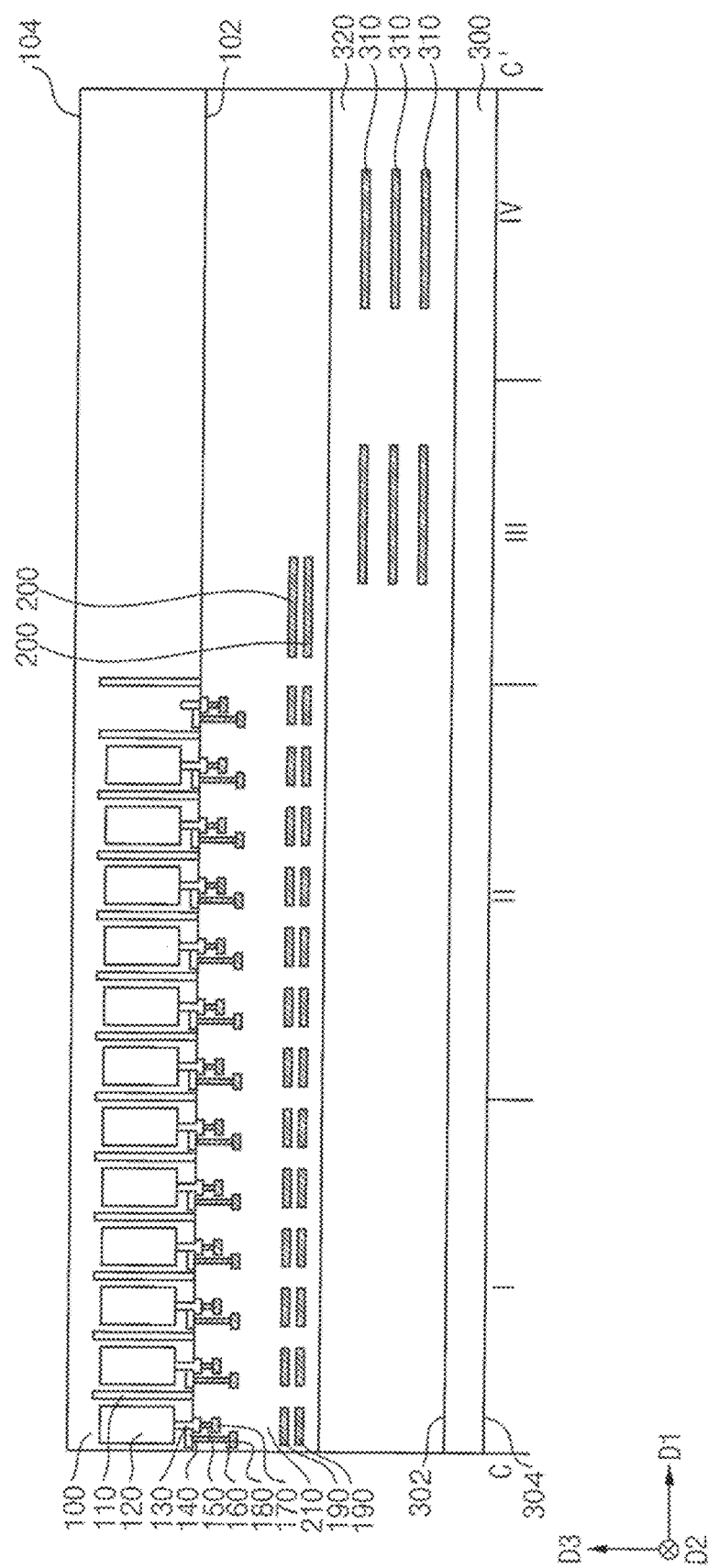

Referring to FIG. 13, the first insulating interlayer 210 on the first substrate 100 and the second insulating interlayer 320 on the second substrate 300 may be bonded with each other, and a portion of the first substrate 100 adjacent to the second surface 104 may be removed.

In some example embodiments, the first and second insulating interlayers 210 and 320 may be bonded through a bonding layer (not shown). Alternatively, the first and second insulating interlayers 210 and 320 may be bonded with no bonding layer. After bonding the first and second insulating interlayers 210 and 320, the bonded structure may be overturn so that the second surface 104 of the first substrate 100 may face upward, and hereinafter, the bonded structure will be explained with the second surface 104 of the first substrate 100 facing upward.

As the first and second substrates 100 and 300 are bonded with each other, the fifth wirings 310 on the second substrate 300 may be disposed in the third and fourth regions III and IV.

In some example embodiments, the portion of the first substrate 100 adjacent to the second surface 104 may be removed by a polishing process, e.g., a grinding process. Thus, the pixel division pattern 110 may be exposed, and the pixel division pattern 110 may extend through the first substrate 100.

Figure 14:
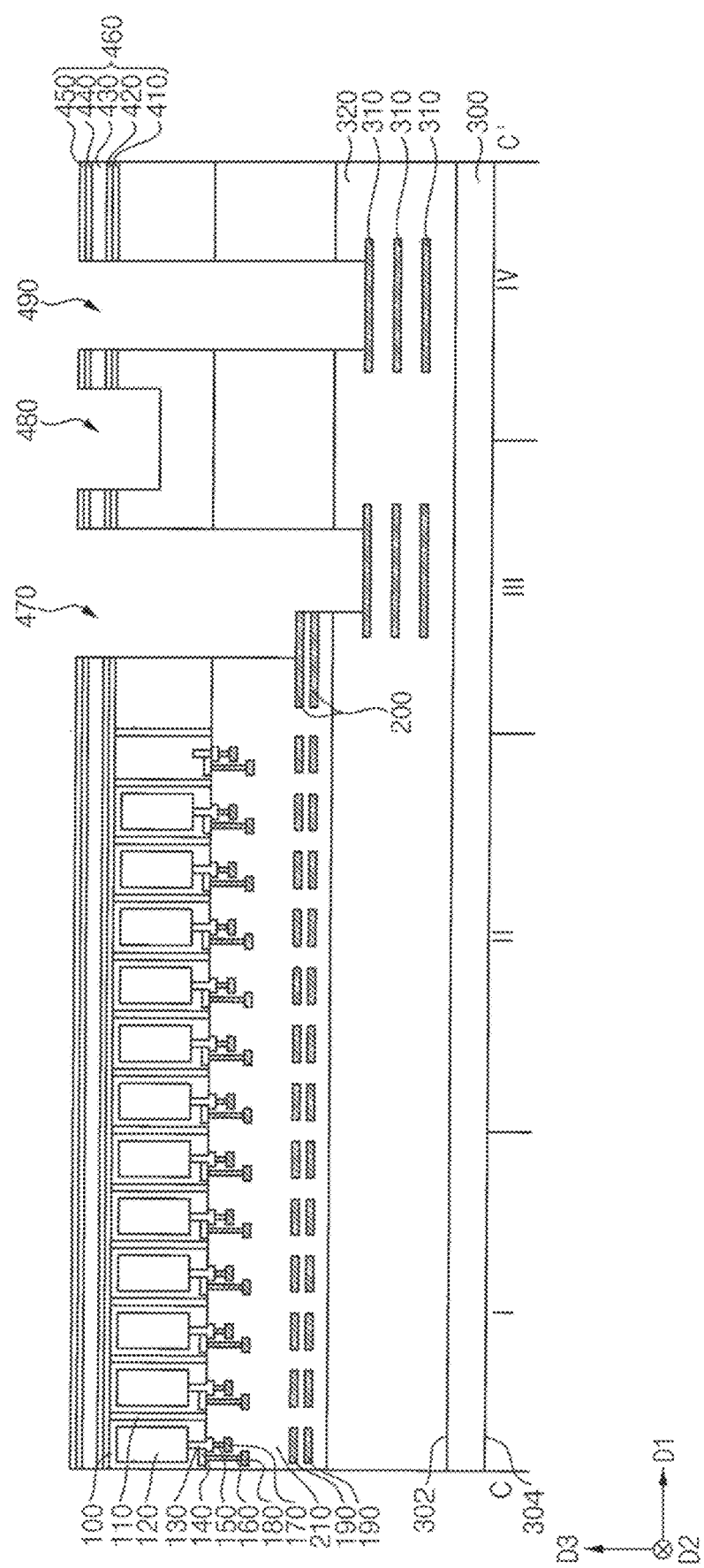

Referring to FIG. 14, a lower planarization layer 460 may be formed on the second surface 104 of the first substrate 100.

In some example embodiments, the lower planarization layer 460 may include first to fifth layers 410, 420, 430, 440 and 450 sequentially stacked in the third direction D3.

The lower planarization layer 460, the first substrate 100, the first insulating interlayer 210 and an upper portion of the second insulating interlayer 320 in the third region III may be partially removed to form a first opening 470, the lower planarization layer 460 and an upper portion of the first substrate 100 in the fourth region IV may be removed to form a third trench 480, and the lower planarization layer 460, the first insulating interlayer 210 and an upper portion of the second insulating interlayer 320 in the fourth region IV may be removed to form a second opening 490.

The first opening 470 may expose the fourth wiring 200 in the first insulating interlayer 210 and the fifth wiring 310 in the second insulating interlayer 320, and the second opening 490 may expose the fifth wiring 310 in the second insulating interlayer 320.

Figure 15:
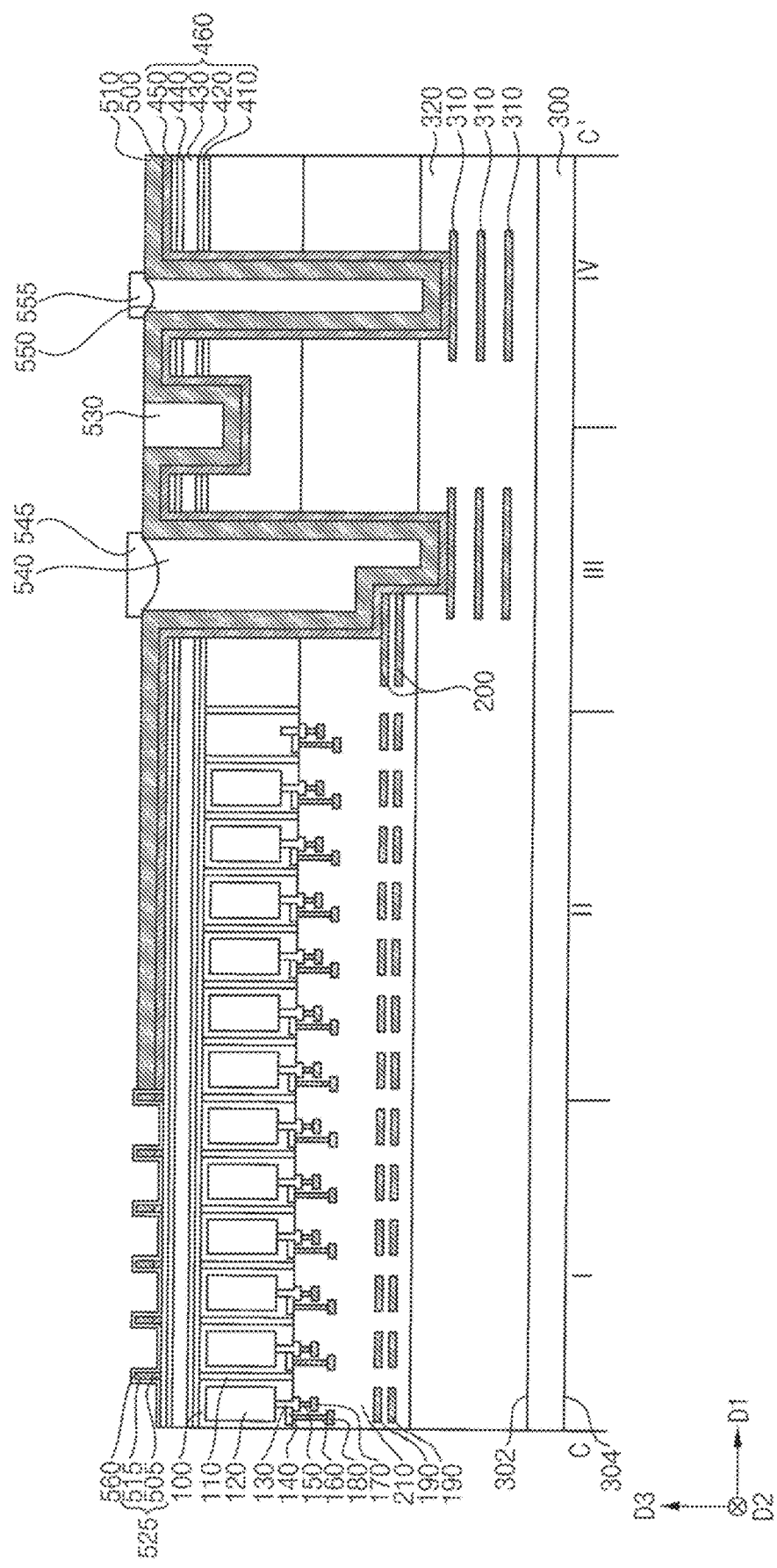

Referring to FIG. 15, a barrier layer 500 and a first conductive layer 510 may be sequentially formed on bottoms and sides of the first and second openings 470 and 490 and the third trench 480 and an upper surface of the lower planarization layer 460, a second conductive layer may be formed on the first conductive layer to fill the third trench 480, and an upper portion of the second conductive layer may be exposed until an upper surface of the first conductive layer is exposed.

Thus, a pad 530 may be formed on the first conductive layer in the third trench 480 in the fourth region IV.

The planarization process may be performed by, e.g., a chemical mechanical polishing (CMP) process and/or an etch back process.

A filling layer may be formed on the first conductive layer and the pad 530 to fill the first and second openings 470 and 490, and an upper portion of the filling layer may be planarized until an upper surface of the first conductive layer is exposed.

An additional etching process may be performed on the filling layer so that a first filling pattern 540 may be formed on the first conductive layer in the first opening 470 in the third region III, and a second filling pattern 550 may be formed on the first conductive layer in the second opening 490 in the fourth region IV.

A capping layer may be formed on the first and second filling patterns 540 and 550 and the pad 530 and patterned to form first and second capping patterns 545 and 555 on the first and second filling patterns 540 and 550, respectively.

Portions of the barrier layer and the first conductive layer in the first region I may be patterned to form first interference blocking pattern 505 and a second interference blocking pattern 515, respectively, and portions of the barrier layer and the first conductive layer in the second region II may remain as a barrier pattern 500 and a conductive pattern 510, respectively.

An upper surface of the lower planarization layer 460 in the first region I may be partially exposed.

Portions of the barrier pattern 500, the conductive pattern 510, the first filling pattern 540 and the first capping pattern 545 in the first opening 470 in the third region III may form a first through via structure, and portions of the barrier pattern 500, the conductive pattern 510, the second filling pattern 550 and the second capping pattern 555 in the second opening 490 in the fourth region IV may form a second through via structure.

A protection layer 560 may be formed on the lower planarization layer 460 and the interference blocking structure 525 in the first region I.

Figure 16:
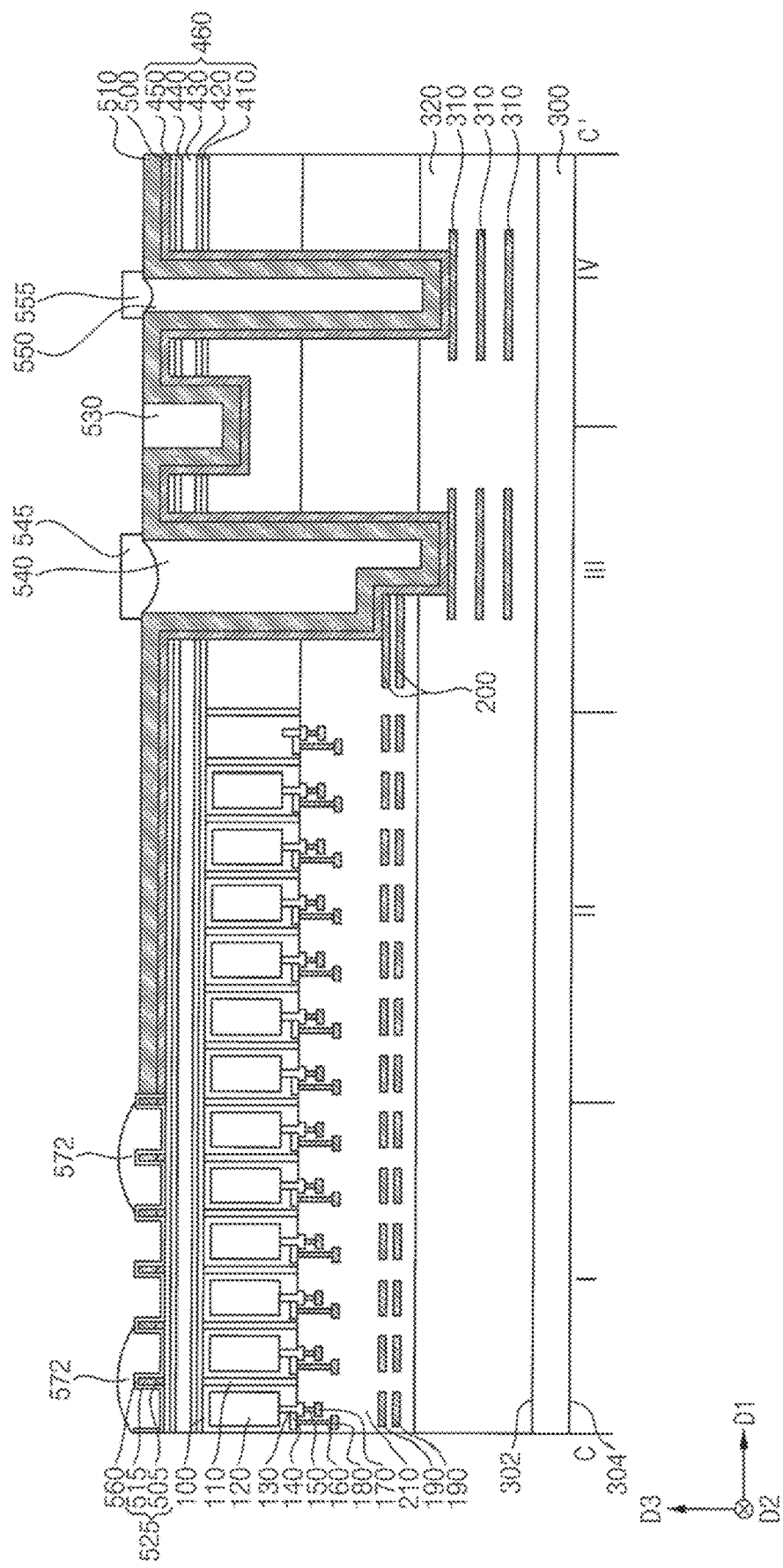
Figure 17:
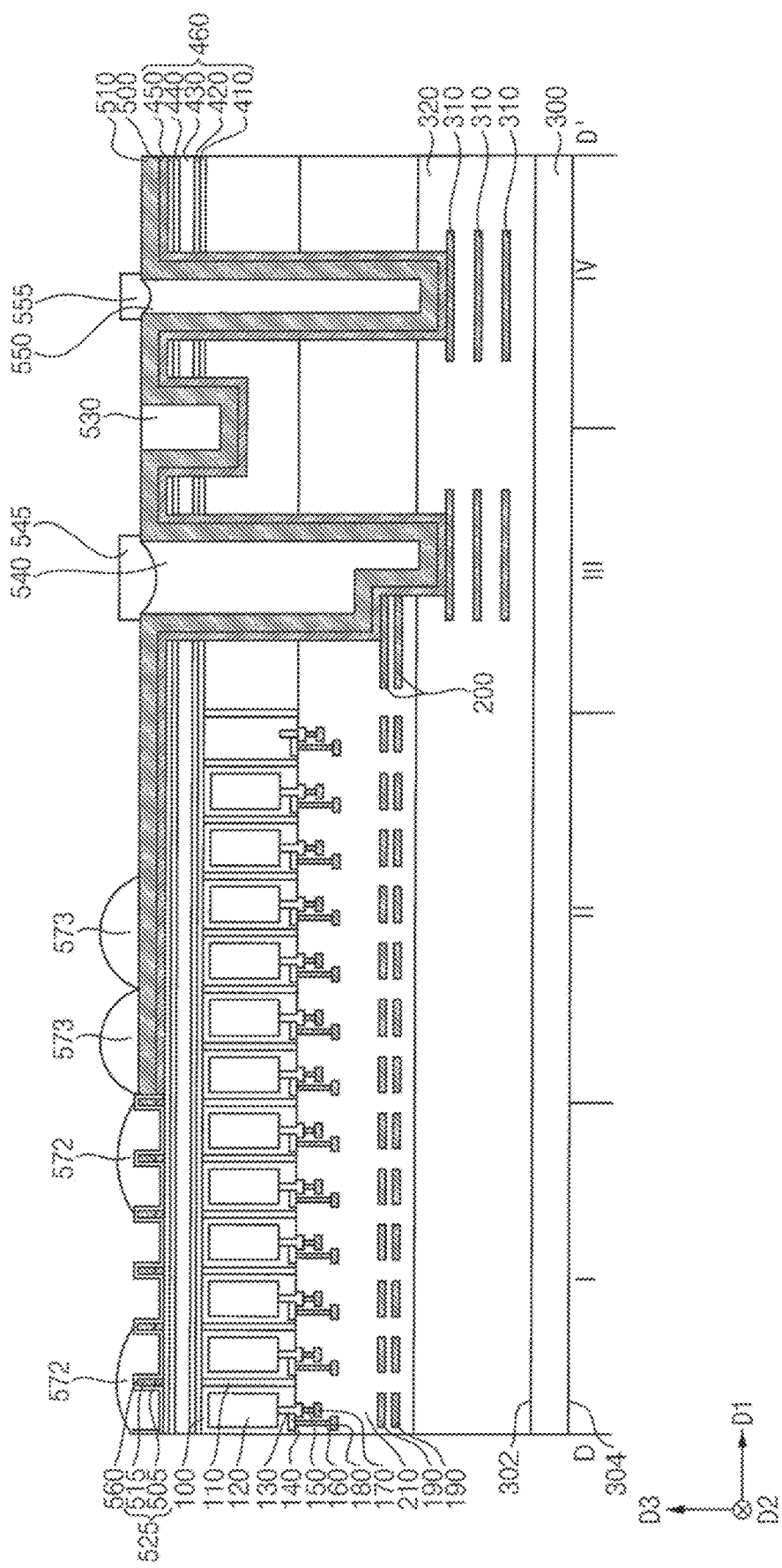

Referring to FIGS. 16 and 17, a first color filter 572 may be formed on the protection layer 560 in the first region I, and a dummy color filter layer 585 including a first dummy color filter 573 may be formed on the conductive pattern 510 in the second region II.

In some example embodiments, the first color filter 572 and the first dummy color filter 573 may be formed by depositing a first color filter layer on the protection layer 560, the conductive pattern 510, the first and second capping patterns 545 and 555 and the pad 530, e.g., through a spin coating process, and performing an exposure process and a developing process on the first color filter layer. Thus, the first color filter 572 may be formed in a first portion of an area that may be defined by the interference blocking structure 525, and the first dummy color filter 573 may be formed in a portion of the second region II adjacent to each vertex of the first region I having a rectangular shape in a plan view.

Figure 18:
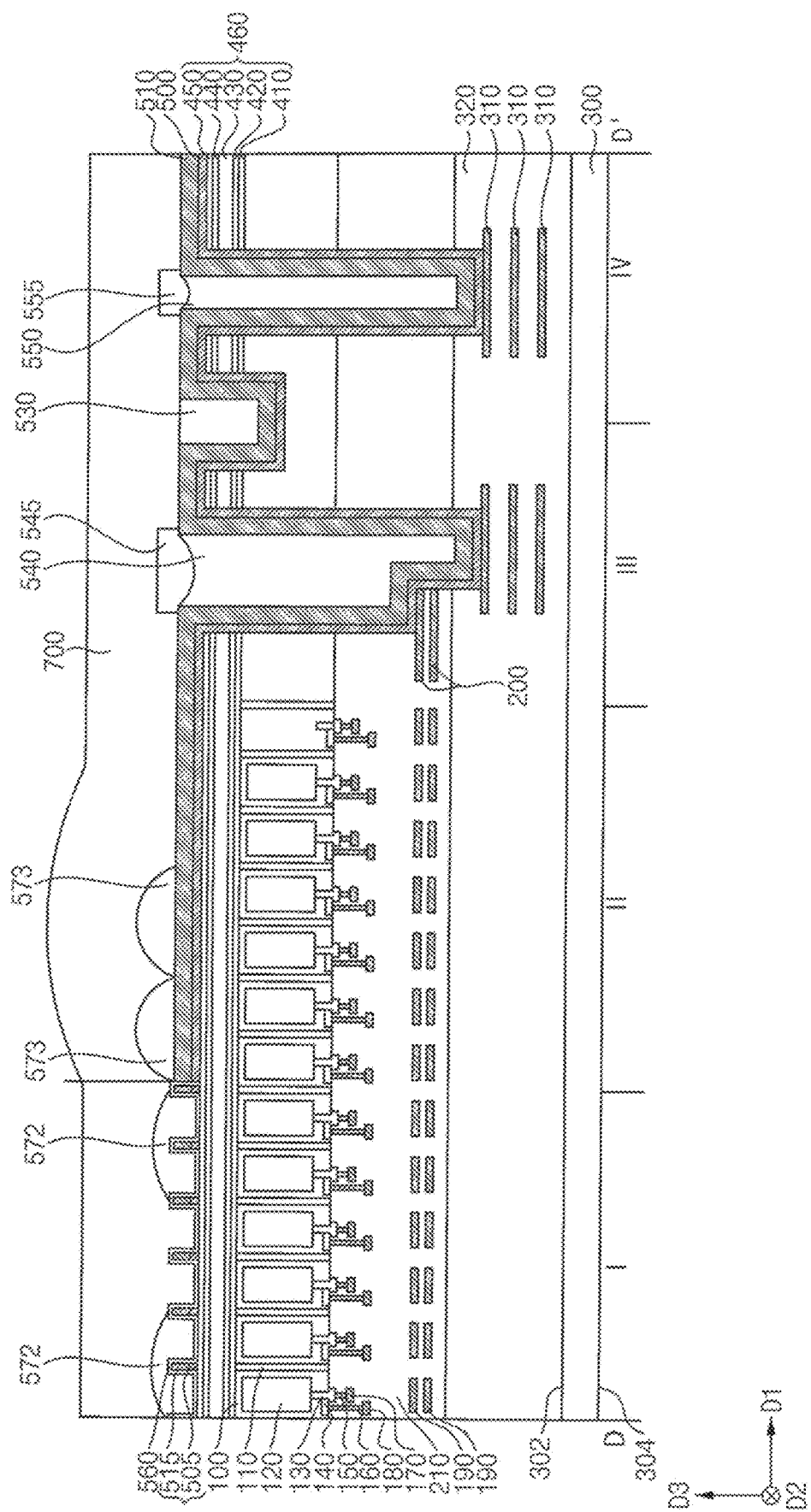

Referring to FIG. 18, a rinsing process may be performed so as to remove a portion of the first color filter layer remaining in an undesired area. The rinsing process may be performed using a rinsing solution 700 including, e.g., deionized water, and a drying process may be further performed to remove the portion of the first color filter layer.

During the rinsing process, components of a developing solution used in the developing process and components of the first color filter layer may be mixed into the rinsing solution 700, and the components may cause spots if the components partially remain in the first region I after the drying process.

Generally, the rinsing solution 700 may have a largest thickness at a boundary between the first and second regions I and II due to the difference of surface tensions of the underlying structures including different materials from each other in the first and second regions I and II, respectively, e.g., the first color filter 572 and the conductive pattern 510. Thus, the components of the developing solution and the first color filter layer mixed into the rinsing solution 700 may remain at the boundary between the first and second regions I and II after the drying process to generate spots. Particularly, the spots may be generated at a portion of the second region II adjacent to the vertex of the first region I having a rectangular shape.

However, in accordance with example embodiments, the first dummy color filter 573 may be formed on the portion of the second region II adjacent to the vertex of the first region I having the rectangular shape, and thus the underlying structures, e.g., the first color filter 572 and the first dummy color filter 573 including the same material may be formed at the boundary between the first and second regions I and II. Accordingly, during the rinsing process, the rinsing solution 700 may have a largest thickness not at the boundary between the first and second regions I and II, but at an inside of the second region II, particularly, between the first dummy color filter 573 and the conductive pattern 510. As a result, the components of the developing solution and the first color filter layer mixed into the rinsing solution 700 may remain not at an inside of the first region I but at an inside of the second region II after the drying process to generate spots, which may not cause image failure because the active pixels are not formed in the second region II.

In some example embodiments, the first dummy color filter 573 may be formed at a portion of the second region II adjacent to each side of the first region I having the rectangular shape, and in this case, the spots may not be generated at any edge portion of the first region I.

Figure 19:
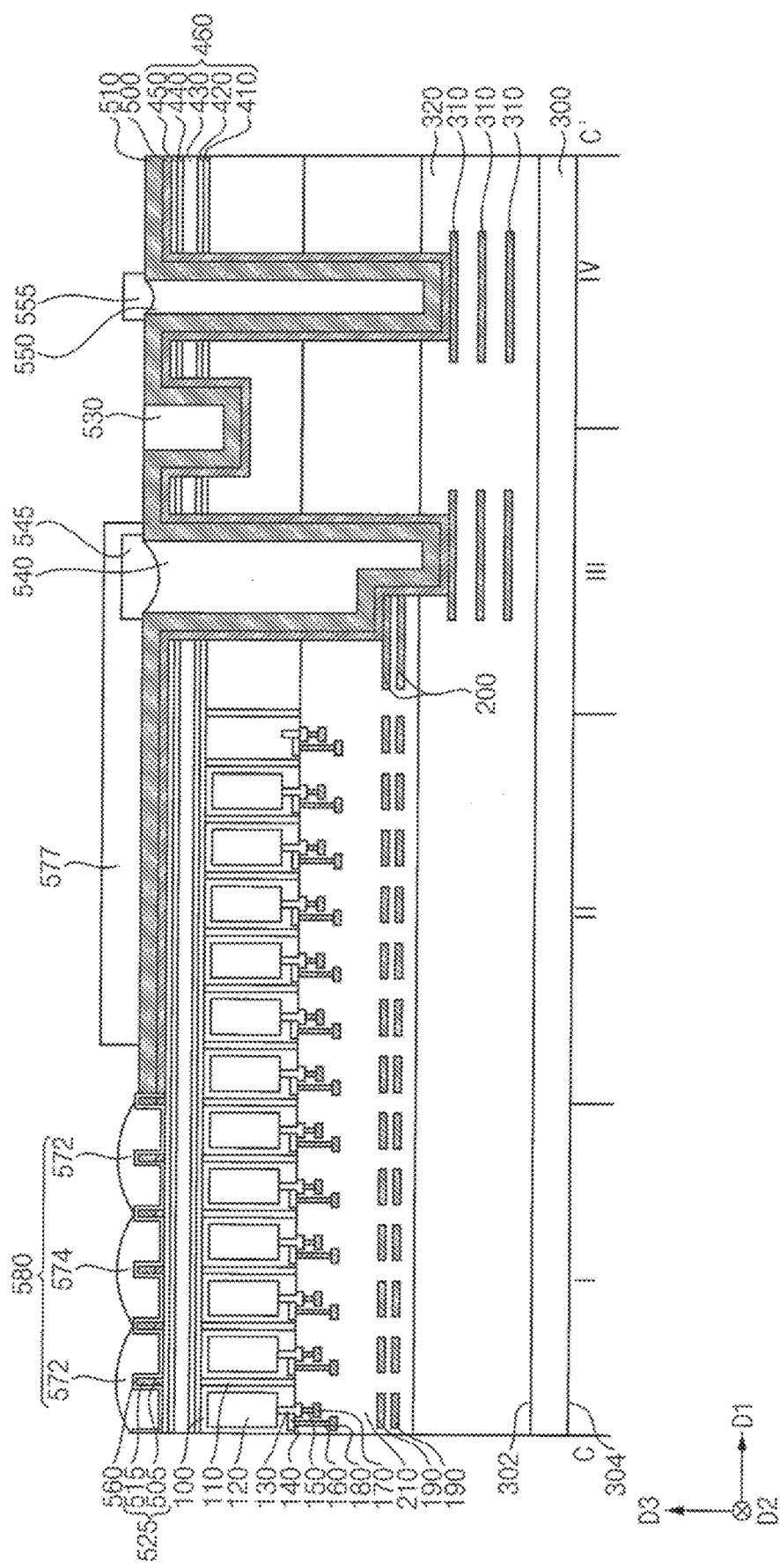
Figure 20:
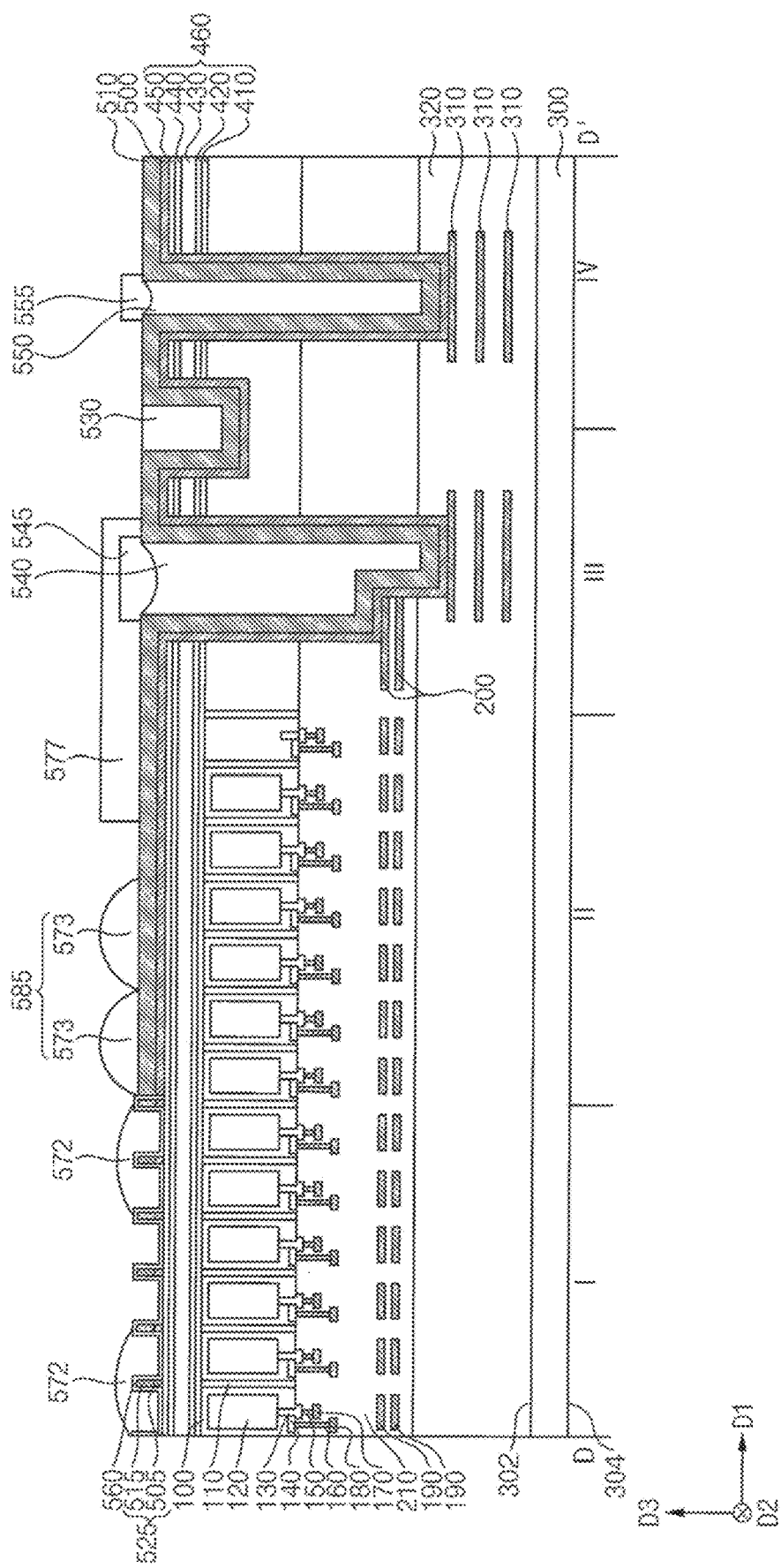

Referring to FIGS. 19 and 20, a second color filter 574 may be formed on the protection layer 560 in the first region I, and a light blocking color filter layer 577 may be formed on the conductive pattern 510 and the first through via structure in the second and third regions II and III.

In some example embodiments, the second color filter 574 and the light blocking color filter layer 577 may be formed by depositing a second color filter layer on the protection layer 560, the first color filter 572, the first dummy color filter 573, the conductive pattern 510, the first and second capping patterns 545 and 555 and the pad 530 through, e.g., a spin coating process, and performing an exposure process and a developing process on the second color filter layer. Thus, the second color filter 574 may be formed in a second portion of the area that may be defined by the interference blocking structure 525, and the light blocking color filter layer 577 may be formed in a portion of the second region II spaced apart by a given distance in the horizontal direction from the first region I and the first dummy color filter 573.

A rinsing process may be performed so as to remove a portion of the second color filter layer remaining in an undesired area, and a drying process may be further performed to remove the portion of the second color filter layer. As illustrated above, the first dummy color filter 573 may be formed at the portion of the second region II adjacent to the vertex of the first region I having the rectangular shape, and thus no spots may be generated in the first region I after the drying process.

Processes substantially the same as or similar to those for forming the first and second color filters 572 and 574 may be performed to form a third color filter in a third portion of the area that may be defined by the interference blocking structure 525. Thus, a color filter array layer 580 including the first color filter 572, the second color filter 574 and the third color filter may be formed.

In some example embodiments, the first color filter 572, the second color filter 574 and the third color filter may be a green filter G, a blue filter B and a red filter R, respectively. Thus, the first dummy color filter 573 may be a dummy green filter G correspondingly to the first color filter 572.

However, the inventive concepts may not be limited thereto. For example, the first color filter 572, the second color filter 574 and the third color filter may be a red filter R, a blue filter B and a green filter G, respectively. In this case, the first dummy color filter 573 may be a dummy red filter R correspondingly to the first color filter 572.

Additionally, the blue color filter B that may be formed together with the light blocking color filter layer 577 may not be formed during the formation process of the second color filter, and may be formed, e.g., during the formation process of the third color filter. In this case, for example, the first color filter 572, the second color filter 574 and the third color filter may be a green filter G, a red filter R and a blue filter B, respectively, or a red filter R, a green filter G and a blue filter B, respectively.

Further, the dummy color filter layer 585 may not have one color. For example, when the first color filter 572 is formed, the first dummy color filter 573 may be formed at a portion of the second region II closest to the first region I, and when the second color filter 574 and/or the third color filter are formed, the second dummy color filter and/or the third dummy color filter may be formed at a portion of the second region II less close to the first region I. In this case, the dummy color filter layer 585 may include not only the first dummy color filter 573 having a first color, but also the second dummy color filter having a second color and/or the third dummy color filter having a third color.

Likewise, if the dummy color filter layer 585 is formed to include a plurality of dummy color filters having various colors, the first dummy color filter 573 may be formed at the portion of the second region II closest to the first region I during the formation of the first color filter, and thus the spots may be generated not in the first region I but in the second region II.

Referring to FIGS. 6 to 9 again, an upper planarization layer 610 may be formed on the color filter array layer 580, the protection layer 560, the dummy color filter layer 585, the light blocking color filter layer 577, the pad 530 and the second capping pattern 555 in the first to fourth regions I, II, III and IV, and a patterning process and a reflow process may be performed on the upper planarization layer 610 in the first region I to form a microlens 600.

A transparent protection layer 620 may be formed on the microlens 600 and the upper planarization layer 610, and a portion of the transparent protection layer 620 overlapping the pad 530 in the third direction D3 in the fourth region IV and a portion of the upper planarization layer 610 thereunder may be removed to form a third opening 630 exposing an upper surface of the pad 530.

An upper wiring (not shown) may be further formed to be electrically connected to the pad 530 to complete the fabrication of the image sensor.

As described above, although the present invention has been described with reference to example embodiments, those skilled in the art will readily appreciate that many modifications are possible in the example embodiments without materially departing from the novel teachings and advantages of the present inventive concepts.

What is claimed is:

1. An image sensor comprising:
   a substrate including a first region and a second region surrounding the first region, active pixels in the first region and optical black (OB) pixels in the second region;
   a light sensing element in the substrate;
   a planarization layer on the light sensing element;
   a color filter array layer on the planarization layer on the first region of the substrate, the color filter array layer including color filters;
   a light blocking metal pattern on the planarization layer on the second region of the substrate;
   a dummy color filter layer on the light blocking metal pattern on a portion of the second region adjacent to the first region of the substrate;
   microlens on the color filter array layer, and
   a light blocking color filter layer on the light blocking metal pattern on the second region of the substrate,
   wherein the light blocking color filter layer being spaced apart from the dummy color filter layer in a horizontal direction substantially parallel to an upper surface of the substrate.

2. The image sensor of claim 1, wherein
   the first region has a shape of a rectangle in a plan view, and
   the dummy color filter layer is on a portion of the second region adjacent to each vertex of the first region.

3. The image sensor of claim 1, wherein
   the first region has a shape of a rectangle in a plan view, and
   the dummy color filter layer is on a portion of the second region adjacent to each side of the first region so as to have a shape of a rectangular ring in a plan view.

4. The image sensor of claim 1, wherein the dummy color filter layer includes a plurality of dummy color filters arranged in a horizontal direction substantially parallel to an upper surface of the substrate.

5. The image sensor of claim 4, wherein
   the color filter array layer includes first, second, and third color filters arranged in the horizontal direction, the first to third color filters having different colors from each other, and
   the plurality of dummy color filters include a first dummy color filter having the same color as the first color filter.

6. The image sensor of claim 5, wherein the first color filter and the first dummy color filter a green light.

7. The image sensor of claim 5, wherein the plurality of dummy color filters include a second dummy color filter having the same color as the second color filter.

8. The image sensor of claim 7, wherein
   the first dummy color filter is on a first portion of the second region of the substrate, and
   the second dummy color filter is on a second portion of the second region of the substrate, the first portion being closer to the first region of the substrate than the second portion.

9. The image sensor of claim 1, wherein
   the color filter array layer includes first, second and third color filters arranged in the horizontal direction, the first to third color filters having different colors from each other, and
   the light blocking color filter layer includes a material substantially the same as that of the second color filter.

10. The image sensor of claim 9, wherein the second color filter and the light blocking color filter layer filter a blue light.

11. The image sensor of claim 1, wherein
   the color filter array layer includes a plurality of color filters arranged in a horizontal direction, and
   the image sensor includes an interference blocking structure between the plurality of color filters.

12. The image sensor of claim 11, further comprising a barrier pattern between the planarization layer and the light blocking metal pattern on the second region of the substrate,
   wherein the interference blocking structure includes first and second interference blocking patterns stacked in a vertical direction substantially perpendicular to an upper surface of the substrate, and
   wherein the first interference blocking pattern includes a material substantially the same as that of the barrier pattern, and the second interference blocking pattern includes a material substantially the same as that of the light blocking metal pattern.

13. An image sensor comprising:
   a substrate including a first region and a second region surrounding the first region, active pixels in the first region and optical black (OB) pixels in the second region, the first region having a shape of a rectangle in a plan view;
   a light sensing element in the substrate;
   a planarization layer on the light sensing element;
   a color filter array layer on the planarization layer on the first region of the substrate, the color filter array layer including first, second and third color filters for filtering first, second and third lights having first, second and third colors, respectively;
   a light blocking metal pattern on the planarization layer on the second region of the substrate;
   a dummy color filter layer on the light blocking metal pattern on a portion of the second region adjacent to the first region of the substrate, the dummy color filter layer including a first dummy color filter that includes substantially the same material as the first color filter;
   microlens on the color filter array layer; and
   a light blocking color filter layer on the light blocking metal pattern on the second region of the substrate,
   wherein the light blocking color filter layer being spaced apart from the dummy color filter layer in a horizontal direction substantially parallel to an upper surface of the substrate.

14. The image sensor of claim 13, wherein the dummy color filter layer is on a portion of the second region of the substrate adjacent to each vertex of the first region of the substrate.

15. The image sensor of claim 13, wherein the first dummy color filter is one of a plurality of first dummy color filters arranged in a horizontal direction substantially parallel to an upper surface of the substrate.

16. The image sensor of claim 13, wherein the dummy color filter layer further includes a second dummy color filter including the same material as the second color filter.

17. The image sensor of claim 13, further comprising a light blocking color filter layer on the light blocking metal pattern on the second region of the substrate, the light blocking color filter layer being spaced apart from the dummy color filter layer in a horizontal direction substantially parallel to an upper surface of the substrate.

18. An image sensor comprising:
- a first substrate defining first, second, third and fourth regions at an inside and upper and lower spaces of the first substrate, the second region surrounding the first region, the third region surrounding the second region, and the fourth region surrounding the third region;
- a first insulating interlayer on the first substrate, the first insulating interlayer containing first wirings in the third region;
- a second insulating interlayer on the first insulating interlayer, the second insulating interlayer containing second wirings in the third region;
- a second substrate on the second insulating interlayer;
- a pixel division pattern in the second substrate in the first and second regions, the pixel division pattern defining a unit pixel region for each unit pixel;
- a light sensing element in each unit pixel region;
- a transfer gate (TG) extending through a lower portion of the second substrate, the TG contacting the light sensing element;
- a floating diffusion (FD) region at a lower portion of the second substrate adjacent to the TG;
- a lower planarization layer on the second substrate;
- a color filter array layer on the lower planarization layer, the color filter array layer including color filters;
- an interference blocking structure between the color filters;
- microlens on the color filter array layer;
- a light blocking metal pattern on the lower planarization layer in the second region;
- a dummy color filter layer on the light blocking metal pattern in a portion of the second region adjacent to the first region;
- a through via structure extending through the lower planarization layer, the second substrate, the second insulating interlayer, and an upper portion of the first insulating interlayer in the third region, the through via structure commonly contacting the first and second wirings;
- a light blocking color filter layer on the light blocking metal pattern and the through via structure in the second and third regions; and
- a pad extending through the lower planarization layer and an upper portion of the second substrate.

19. The image sensor of claim 18, wherein
the first region is an active pixel region including active pixels,
the second region is an optical black (OB) pixel region including OB pixels,
the third region is a stack region including the through via structure, and
the fourth region is a pad region including the pad.

* * * * *